(12) United States Patent
Fischer et al.

(10) Patent No.: US 7,229,683 B2
(45) Date of Patent: *Jun. 12, 2007

(54) THERMAL INTERFACE MATERIALS AND METHOD OF MAKING THERMAL INTERFACE MATERIALS

(75) Inventors: Patrick J. Fischer, St. Paul, MN (US); James J. Kobe, Newport, MN (US); Cameron T. Murray, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 103 days.

This patent is subject to a terminal disclaimer.

(21) Appl. No.: 10/449,156

(22) Filed: May 30, 2003

(65) Prior Publication Data

US 2004/0241410 A1 Dec. 2, 2004

(51) Int. Cl.
*B32B 17/12* (2006.01)
*B32B 13/02* (2006.01)

(52) U.S. Cl. .............................. 428/293.7; 428/297.4; 428/903; 428/347

(58) Field of Classification Search ................ 428/522, 428/515, 516, 517, 354, 345, 343, 355, 921, 428/920, 293.7, 297.4, 347, 903
See application file for complete search history.

(56) References Cited

U.S. PATENT DOCUMENTS

| | | |
|---|---|---|
| RE24,906 E | 12/1960 | Ulrich |
| 3,725,115 A | 4/1973 | Christenson et al. |
| 4,059,714 A | 11/1977 | Scholl et al. |
| 4,234,662 A | 11/1980 | Pastor et al. |
| 4,310,509 A | 1/1982 | Berglund et al. |
| 4,323,557 A | 4/1982 | Rosso et al. |
| 4,361,663 A | 11/1982 | Agarwal et al. |
| 4,472,480 A | 9/1984 | Olson |
| 4,606,962 A | 8/1986 | Reylek et al. |

(Continued)

FOREIGN PATENT DOCUMENTS

DE 198 51 166 A1 5/2000

(Continued)

OTHER PUBLICATIONS

"Viscoelastic Properties of Pressure Sensitive Adhesives", Handbook of Pressure Sensitive Adhesive Technology, Second Edition, Edited by Donatas Satas, 1989, pp. 172, 173, 174, 175, 202, 203.

(Continued)

*Primary Examiner*—N. Edwards
(74) *Attorney, Agent, or Firm*—Scott A. Bardell

(57) ABSTRACT

In one aspect, the invention provides a method of making a thermal interface material comprising the steps of: (a) providing a polymeric hot melt pressure sensitive adhesive having a number average molecular weight of greater than 25,000; (b) melt-blending the polymer with at least 25 weight percent of a thermally conductive filler to form a mixture; and (c) forming the mixture of hot melt pressure sensitive adhesive and thermally conductive filler as a film. In another aspect, the invention may further comprise the steps of: providing a fire retardant and/or microfiber forming material; and/or irradiating the film with gamma or electron beam (E-beam) radiation or a combination of both to form a thermal interface material.

9 Claims, 3 Drawing Sheets

U.S. PATENT DOCUMENTS

| | | | |
|---|---|---|---|
| 4,851,278 A | 7/1989 | Enanoza | |
| 5,026,742 A | 6/1991 | Rehmer | |
| 5,049,085 A | 9/1991 | Reylek et al. | |
| 5,100,728 A | 3/1992 | Plamthottam et al. | |
| 5,187,235 A | 2/1993 | Bordoloi et al. | |
| 5,194,455 A | 3/1993 | Massow et al. | |
| 5,232,970 A * | 8/1993 | Solc et al. | 524/404 |
| 5,399,416 A | 3/1995 | Bujard | |
| 5,416,127 A | 5/1995 | Chandran et al. | |
| 5,429,856 A | 7/1995 | Krueger et al. | |
| 5,550,175 A | 8/1996 | Bredahl et al. | |
| 5,738,936 A | 4/1998 | Hanrahan | |
| 5,753,362 A | 5/1998 | Kawase et al. | |
| 5,804,610 A * | 9/1998 | Hamer et al. | 522/182 |
| 5,890,915 A | 4/1999 | Reylek | |
| 5,904,796 A | 5/1999 | Freuler et al. | |
| 5,932,298 A * | 8/1999 | Moon | 427/496 |
| 6,054,198 A | 4/2000 | Bunyan et al. | |
| 6,103,152 A * | 8/2000 | Gehlsen et al. | 264/45.4 |
| 6,197,397 B1 | 3/2001 | Sher et al. | |
| 6,207,272 B1 | 3/2001 | Takahira et al. | |
| 6,277,488 B1 | 8/2001 | Kobe et al. | |
| 6,432,497 B2 | 8/2002 | Bunyan | |
| 6,866,928 B2 * | 3/2005 | Narum et al. | 428/354 |
| 2001/0055878 A1 | 12/2001 | Murata et al. | |
| 2002/0128336 A1 | 9/2002 | Kolb et al. | |
| 2002/0155243 A1 | 10/2002 | Kobe et al. | |
| 2002/0187294 A1 | 12/2002 | Zhou et al. | |

FOREIGN PATENT DOCUMENTS

| | | |
|---|---|---|
| EP | 0 566 093 A1 | 10/1993 |
| EP | 0 878 527 A1 | 11/1998 |
| JP | 2003-49144 | 2/2003 |
| WO | WO 95/25774 * | 9/1995 |
| WO | WO 99/05722 | 2/1999 |
| WO | WO 01/57152 A2 | 8/2001 |
| WO | WO 01/76855 A1 | 10/2001 |
| WO | WO 02/20687 A2 | 3/2002 |
| WO | WO 03/066766 A1 | 8/2003 |
| WO | WO 04/056932 A1 | 7/2004 |
| WO | WO 2004/061036 A1 | 7/2004 |

OTHER PUBLICATIONS

Introduction to Physical Polymer Science, Chapter 1, p. 6, L. H. Sperling ISBN 0-471-89092-8, 1986.

* cited by examiner

THERMAL INTERFACE MATERIALS AND METHOD OF MAKING THERMAL INTERFACE MATERIALS

BACKGROUND

Integrated circuits, active and passive components, optical disk drives, and the like generate heat under use conditions that must be diffused to allow continuous use of the heat-generating component. Heat sinks in the form of finned metal blocks and heat spreaders containing heat pipes are commonly attached to these heat-generating components to allow excess heat to be conducted away and radiated into the atmosphere. Materials useful for providing a thermal bridge between the heat generating components and heat sinks/heat spreaders are known. Many of these materials are based on gel masses, liquid to solid phase change compounds, greases, or pads that must be mechanically clamped between the heat generating component and heat sink/heat spreader.

More recently, thermally conductive materials incorporating adhesives have been introduced. These thermally conductive adhesive materials typically form an adhesive bond between the heat generating component and heat sink/heat spreader so that no mechanical clamping is required. Both heat-activated (hot melt) and pressure sensitive adhesives have been used in thermally conductive adhesives. In all cases, these thermal interface materials need to be thermally enhanced (compared with unfilled or lightly filled polymer compositions), be dimensionally stable at elevated temperatures (heat generating components often run at 50° C. or higher) and be soft and conformable enough to provide good contact (wet-out) between the substrates.

Thermal interface materials can be prepared by a number of known methods. One method is dispersing thermally conductive particles in a low viscosity material, such as a monomer or low molecular weight polymer, followed by polymerization and/or curing and/or crosslinking of the monomer or low molecular weight polymer. For example,f EP Publication No. 0566093 describes preparing thermally conductive electrically insulating pressure sensitive adhesives by blending thermally conductive, electrically insulating particles in reactive monomers and/or oligomers or in a partially photopolymerized syrup, degassing the mixture, coating the composition between two silicone-release treated films, and photopolymerizing the coating to a pressure sensitive adhesive state. Another method is the addition of low molecular weight components to high molecular weight components to provide a suitable viscosity to assist incorporation of the thermally conductive particles. Yet another method is the use of a hot melt coatable PSA composition and crosslinking by use of actinic radiation. Initial attempts with relatively low molar mass hot melt PSA compositions failed to attain good elevated temperature shear performance. Subsequent improvements in this hot melt PSA method have focused on the addition of radiation sensitive, multifunctional, small molecules to improve the crosslinking step. Several different small molecules have been suggested modestly improve elevated temperature shear performance. These methods have certain disadvantages of requiring multiple processing steps and/or multiple component compositions, which add to overall cost of manufacturing.

In some applications, there is a need for rework and/or repair, such as for example, attaching an aluminum frame to a plasma display panel (PDP). In these applications, a thermally conductive adhesive interface article with an easily removable attachment system, such as a stretch-releasable attachment system would be beneficial.

Consequently, it is desirable to provide a simple, cost-effective, method for the manufacture of thermally conductive adhesive interface articles that have acceptable thermal conductivity. It is also desirable to provide the foregoing thermally conductive articles in a fire retardant and/or a stretch-release construction.

SUMMARY

In one aspect, the invention provides a method of making a thermal interface material comprising the steps of:
(a) providing a polymeric hot melt pressure sensitive adhesive having a number average molecular weight of greater than 25,000;
(b) melt-blending the polymer with at least 25 weight percent of a thermally conductive filler to form a mixture; and
(c) forming the mixture of hot melt pressure sensitive adhesive and thermally conductive filler as a film.

In another aspect, the invention may further comprise the steps of:
providing a fire retardant and/or microfiber forming material; and/or
irradiating the film with gamma or electron beam (E-beam) radiation or a combination of both to form a thermal interface material.

In another aspect, the invention provides a thermal interface material comprising a film comprising a blend of polymeric hot melt pressure sensitive adhesive having a number average molecular weight of greater than 25,000 and at least 25 percent by weight of thermally conductive filler, wherein the film is crosslinked, substantially free of added free radical initiators, and substantially free of crosslinking agents.

In another aspect, the invention provides a thermal interface material having stretch release properties comprising a film comprising a blend of polymeric hot melt pressure sensitive adhesive having a number average molecular weight of greater than 25,000 and at least 25 percent by weight of thermally conductive filler, substantially continuous viscoelastic and/or elastic microfibers oriented in the machine direction of the material.

In another embodiment, the invention provides a thermal interface material comprising (a) a film comprising a blend of polymeric hot melt pressure sensitive adhesive having a number average molecular weight of greater than 25,000 and at least 25 percent by weight of thermally conductive filler, and (b) a thermally conductive skin adhesive layer attached to the film.

Other features and advantages of the invention will be apparent to those practicing in the art upon consideration of the Detailed Description and from the appended claims.

DETAILED DESCRIPTION

Figure 1:
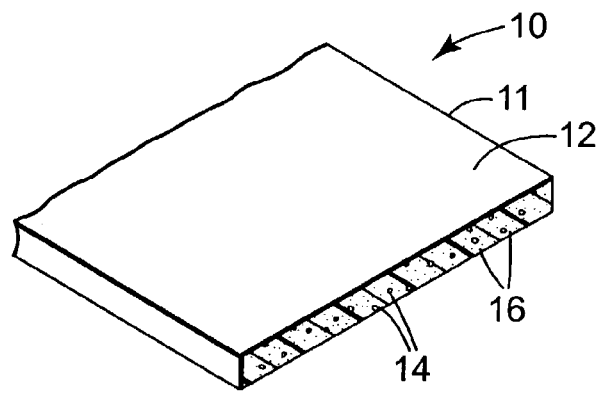
FIG. 1 is a perspective drawing showing a thermal interface material of the invention.

Certain terms are used herein in describing the preferred embodiments of the invention. All such terms are intended to be interpreted in a manner consistent with their usage by those skilled in the art. For convenience, by way of example and not limitation, the following meanings are set forth:

"Fire retardant" refers to a substance that when applied to or incorporated within a combustible material, reduces or eliminates the tendency of the material to ignite and/or reduces the tendency to continue burning once ignited when exposed to heat or flame.

"Stretch release" refers to the property of an adhesive article characterized in that, when the article is pulled and elongated from a substrate surface at a rate of 30 centimeters/minute and at an angle of 45° or less, the article detaches from a substrate surface without leaving a significant amount of visible residue on the substrate or when the article is used between two rigid substrates, the article is pulled and elongated at a rate of 30 centimeters/minute and at an angle of 5° or less, the article detaches without leaving a significant amount of visible residue on at least one of the rigid substrates.

"Substantially continuous" refers to a microfiber that is unbroken for at least about 0.5 cm in the machine direction.

"Substantially free" refers to a component that is present in a TIM of the invention at levels of less than 0.1, 0.09, or 0.08 percent by weight, based on the weight of the polymeric hot melt pressure sensitive adhesive.

The invention provides thermal interface materials (TIMs) comprising a blend of thermally conductive filler and a polymeric hot melt pressure sensitive adhesive substantially free or free of oligomers or low molecular weight polymers, other than residuals resulting from polymerization of the PSA, (that is, <25,000 number average molecular weight), N-tert-butylacrylamide, organic solvent, added free radical initiators, and crosslinking agents, such as multifunctional crosslinking agents and triazines. TIMs of the invention contain less than about 5, 4, 3, 2, or 1 percent void volume as determined by the test method described herein. Voids or void volume decreases bulk thermal conductivity.

The desired characteristics of a TIM according to the invention include one or more of the following: (1) bulk thermal conductivity of at least about 0.5 Watts/meter-K; (2) Shore A hardness less than about 60; (3) static shear strength at 22° C. or 70° C. of at least about 10,000 minutes when tested according to the test methods described below; and (4) when the TIM comprises viscoelastic microfibers, the tensile break strength of at least about 150% of the yield strength of the TIM with an elongation greater than about 200%, and less than about 50% recovery after being elongated 100%, and when the TIM comprises elastic microfibers, the TIM has an elongation greater than about 200% and have greater than about 50% recovery after being elongated 100%. TIMs comprising the continuous adhesive film and/or the optional thermally conductive skin adhesive layer(s) applied to the surfaces of the adhesive film can have high adhesion when applied to a panel, such as 90 degree peel adhesion of greater than about 0.0438 kN/m (4 oz/in), in other embodiments, greater than about 0.176 kN/m, or greater than about 0.352 kN/m.

The polymeric hot melt pressure sensitive adhesive useful in the invention has a number average molecular weight of greater than 25,000; in other embodiments, a number average molecular weight of greater than 100,000, a number average molecular weight of greater than 200,000, or a number average molecular weight of greater than 400,000 (as defined in Introduction to Physical Polymer Science, Chapter 1, page 6, L. H. Sperling ISBN 0-471-89092-8). The polymeric hot melt pressure sensitive adhesive may be selected from any of a variety of polymeric materials, such as rubbers, elastomers, thermoplastic polyurethanes, thermoplastic elastomers, poly-alpha-olefin polymers, acrylate polymers and methacrylate polymers, acrylate and methacrylate copolymers, and combinations of the foregoing.

In general, any hot melt processable pressure sensitive adhesive compositions are suitable. The optional thermally conductive adhesive layer may be a pressure sensitive adhesive, such as, for example, acrylic adhesive, poly-alpha-olefin adhesive, a rubber based adhesive, a silicone adhesive, a blend of rubber based adhesive and acrylic adhesive, and combinations thereof. Likewise, the optional thermally conductive adhesive layer may be a heat-activated adhesive. The film and/or the optional thermally conductive adhesive layer may be provided with individual, substantially continuous polymeric microfibers dispersed in the polymeric adhesive matrix and oriented in the machine direction of the film therein, the microfibers imparting stretch release properties to the article. In addition, the film and/or optional thermally conductive adhesive layer may comprise a fire retardant.

One example of a TIM according to the invention is shown in FIG. 1. TIM 10 comprises a film 11 and has a first surface 12 and a second surface (not shown) opposite the first surface 12. According to the invention, at least one thermally conductive filler 14 is interspersed throughout a polymeric adhesive matrix 16. It will be appreciated that other layers and/or structures may be applied or affixed to the first surface 12 of the film 11. In associating other layers or structures with the surface 12, a layer of a thermally conductive skin adhesive may first be applied to the first surface 12 to bond the additional layers or structures to the surface 12. Likewise, the TIM 10 may be provided as a two-sided tape having another adhesive layer, in particular a thermally conductive adhesive layer, on the surface opposite the first surface 12. A release liner or the like may be associated with the skin adhesive(s) on either or both of the surfaces of the film 11.

Figure 2:
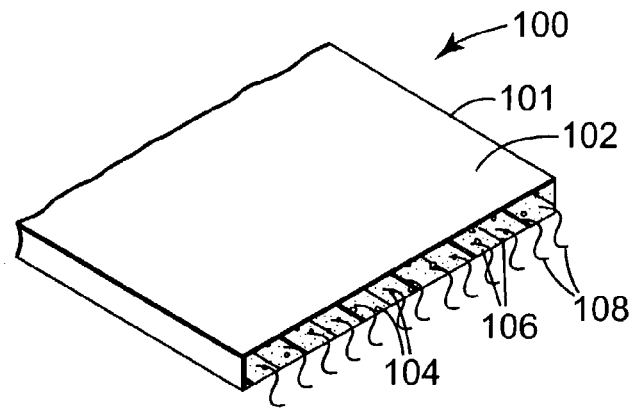
FIG. 2 is a perspective drawing showing a second thermal interface material.

Another embodiment of the invention is shown in FIG. 2. TIM 100 is in the form of a film 101 having a first surface 102 and a second surface opposite the first surface (not shown). According to this embodiment of the invention, at least one thermally conductive filler 104 and individual substantially continuous viscoelastic and/or elastic microfibers 108 are interspersed throughout a polymeric adhesive matrix 106 and oriented in the machine direction. It will be appreciated that other layers and/or structures may be applied or affixed to the surfaces 102 of the film 101. In associating other layers or structures with the surface 102, a layer of a thermally conductive skin adhesive may first be applied to the first surface 102 to bond the additional layers or structures to the surface 102. Likewise, the TIM 100 may be provided as a two-sided tape having another adhesive layer, in particular a thermally conductive adhesive layer, on the surface opposite the first surface 102. A release liner or the like may be associated with the skin adhesive(s) on either or both of the surfaces of the film 101.

Figure 3:
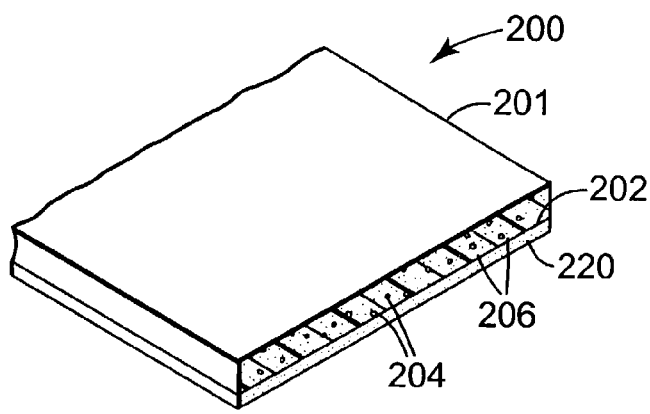
FIG. 3 is a perspective drawing of a thermal interface material featuring a film combined with a thermally conductive skin adhesive layer.

FIG. 3 depicts yet another embodiment of the invention, TIM 200, in which a thermally conductive skin adhesive layer 220 is provided on one of the surfaces 202 of the film 201 comprising a blend of thermally conductive particles 204 and polymeric adhesive 206. The skin adhesive layer 220 may comprise any of a variety of adhesive materials and thermally conductive fillers as are further described herein. The adhesive used in skin adhesive layer 220 is generally selected for its adhesive properties in the intended application or use. Typically, the skin adhesive layer 220 is a thermally conductive pressure sensitive adhesive generally formulated without fire retardant materials therein. A release liner (not shown) may optionally be included to protect the skin adhesive layer 220 prior to the application of the skin adhesive layer 220 to another substrate or the like.

The hot melt pressure sensitive adhesives (prior to compounding with thermally conductive filler) useful in the invention has a number average molecular weight of greater than 25,000 and is tacky at room temperature (about 22° C.). Pressure sensitive adhesives (PSAs) are a distinct category of adhesives which in dry (solvent-free) form are permanently tacky at room temperature. They firmly adhere to a variety of dissimilar surfaces upon mere contact without the need of more than finger or hand pressure. Pressure sensitive adhesives require no activation by water, solvent, or heat to exert a relatively strong adhesive holding force. PSAs can be quantitatively described using the "Dahlquist criteria" which maintains that the elastic modulus of these materials is less than $10^6$ dynes/cm$^2$ at room temperature. See Pocius, A. V., Adhesion & Adhesives: An Introduction, Hanser Publishers, New York, N.Y., First Edition, 1997. The polymer matrices of the invention may comprise one or more pressure sensitive adhesives (PSA). It may be desirable to use two or more PSA polymers having different compositions to achieve unique properties. A wide range of physical properties can be obtained by selectively choosing the PSA component types and concentrations. A particular polymer may be selected based upon the desired properties of a final article.

The hot melt pressure sensitive adhesive may be any of a variety of different polymer materials including elastomers, rubbers, thermoplastic elastomers, poly-alpha-olefins polymers, acrylic polymers, and blends thereof. Typically, the polymer materials are of the type that are suitable for melt extrusion processing, as described in, for example, U.S. Pat. No. 6,103,152, incorporated in its entirety herein by reference thereto. It may be desirable to blend two or more polymers having chemically different compositions. A particular polymer is generally chosen or selected based upon the desired properties of the final TIM. It is recognized that the polymer material used to prepare the hot melt PSA may contain residual amounts of free radical initiators, oligomers or low molecular weight polymers (<25,000 number average molecular weight), N-tert-butylacrylamide, or organic solvent.

Suitable materials for producing a useful hot melt pressure sensitive adhesive include acrylate and methacrylate polymers or co-polymers. Such polymers can be formed by polymerizing 50 to 100 parts by weight of one or more monomeric acrylic or methacrylic esters of non-tertiary alkyl alcohols, with the alkyl groups having from 1 to 20 carbon atoms (e.g., from 3 to 18 carbon atoms). Suitable acrylate monomers include methyl acrylate, ethyl acrylate, n-butyl acrylate, lauryl acrylate, 2-ethylhexyl acrylate, cyclohexyl acrylate, iso-octyl acrylate, octadecyl acrylate, nonyl acrylate, decyl acrylate, isobornyl acrylate, and dodecyl acrylate. Also useful are aromatic acrylates, e.g., benzyl acrylate and cyclobenzyl acrylate. In some applications, it may be desirable to use less than 50 parts by weight of the monomeric acrylic or methacrylic esters. Optionally, one or more monoethylenically unsaturated co-monomers may be polymerized with the acrylate monomers in amounts from about 0 to 50 parts co-monomer. One class of useful co-monomers includes those having a homopolymer glass transition temperature greater than the glass transition temperature of the acrylate homopolymer. Examples of suitable co-monomers falling within this class include acrylic acid, acrylamide, methacrylamide, substituted acrylamides, such as N,N-dimethyl acrylamide, itaconic acid, methacrylic acid, acrylonitrile, methacrylonitrile, vinyl acetate, N-vinyl pyrrolidone, isobornyl acrylate, cyano ethyl acrylate, N-vinylcaprolactam, maleic anhydride, hydroxyalkylacrylates, N,N-dimethyl aminoethyl (meth)acrylate, N,N-diethylacrylamide, beta-carboxyethyl acrylate, vinyl esters of neodecanoic, neononanoic, neopentanoic, 2-ethylhexanoic, or propionic acids (e.g., available from Union Carbide Corp. of Danbury, Conn, under the designation VYNATES), vinylidene chloride, styrene, vinyl toluene, and alkyl vinyl ethers.

A second class of useful co-monomers includes those having a homopolymer glass transition temperature less than the glass transition temperature of the acrylate homopolymer. Examples of suitable co-monomers falling within this class include ethoxyethoxy ethyl acrylate (Tg=−71° C.) and methoxypolyethylene glycol 400 acrylate (Tg=−65° C., available from Shin Nakamura Chemical Co., Ltd., under the designation NK Ester AM-90G).

Another group of polymers useful in the present invention includes pressure sensitive and hot melt adhesives prepared from non-photopolymerizable monomers. Such polymers can be adhesive polymers (i.e., polymers that are inherently adhesive), or polymers that are not inherently adhesive but are capable of forming adhesive compositions when compounded with tackifiers. Specific examples include polyurethanes, poly-alpha-olefins (e.g., polyoctene, polyhexene, and atactic polypropylene), block copolymer-based adhesives (SBR, SIS, SBS, SEBS), natural and synthetic rubbers, silicone adhesives, ethylene-vinyl acetate, and epoxy-containing structural adhesive blends (e.g., epoxy-acrylate and epoxy-polyester blends), and combinations thereof.

In some instances, it may be desirable that the thermal interface material have a high service temperature (i.e., up to or greater than 70° C.). This can be accomplished in several known methods. For example, acrylic based adhesives can be crosslinked by irradiation by E-beam, gamma, and the like. In some instances, it may be desirable to first expose the extrudate to E-beam followed by gamma radiation. Block copolymer-based thermal interface materials can have their elevated temperature performance improved through the addition of polyphenylene oxide (PPO) or an end block reinforcing resin to a block copolymer as described in, for example, U.S. Pat. No. 6,277,488, which is incorporated herein by reference.

A number of thermally conductive fillers are suitable for use in the adhesives of the invention. The thermally conductive filler is selected from a variety of materials having a bulk conductivity of between about 5 and 1000 Watts/meter-K as measured according to ASTM D1530. Examples of suitable thermally conductive fillers include but are not limited to, aluminum oxide, beryllia, zirconia, aluminum titanate, silicon carbide, boron carbide, aluminum hydroxide, magnesium hydroxide, titanium dioxide, aluminum nitride, silicon nitride, boron nitride, titanium nitride, and the like, and combinations thereof. These fillers are found in a variety of shapes/forms (spherical, flakes, agglomerates, crystals, acicular, fumed). The choice of shape is dependent upon the rheology of the selected adhesive and ease of processing of the extrudate. Fillers may be available in several crystal types (e.g., hexagonal and rhombic boron nitride) and the type of crystal chosen will depend upon the thermal conductivity of the crystal (including the anisotropic nature of the conductivity along different crystal axes), effect of crystal type on final mechanical properties and cost.

Particle size and distribution affects thermally conductivity, mechanical, and adhesive properties, so particle size selection should accommodate the final adhesive property requirements. In other embodiments, the particle size of the filler (or mixture of fillers) and particle loading are selected to produce suitable thermal conductance while retaining adequate mechanical and adhesive properties.

Typically, useful thermally conductive fillers have an average particle size in the range of from about 0.5 micrometers ($\mu$m) to about 250 $\mu$m. In other embodiments, the thermally conductive fillers may range in average size from about 1 to about 100 $\mu$m and from about 10 to about 70 $\mu$m. The particles may range in average size in any range between 0.5 and 250 $\mu$m and may be any average size between 0.5 and 250 $\mu$m. The adhesive may contain thermally conductive fillers that can bridge the adhesive and/or thermal interface matrix and be exposed through the matrix to a degree increasing with their size. Thus, particles are contained within the pressure sensitive adhesive and improve thermal conductivity in the path between the heat-source substrate and heat-conducting article, such as a heat sink article. These particles are of sufficient size to impinge near or against base of heat sink article such that they impress into or onto its surface prior to or after the heat sink article is placed in service. Generally, increasing the size of these particles to the same adhesive thickness will increase the thermal conductivity between a heat-source substrate and the heat-conducting article.

The choice of particle size depends on the application. For example, particles having a major dimension of at least about 1-2 $\mu$m and about 30 $\mu$m or below, and in other embodiments between about 5 and 20 $\mu$m, are suitable when the bond line will be in the 25 to 100 $\mu$m range (such as found between a central processing unit (CPU) and a heat sink). Particles larger than about 20 to 30 $\mu$m, such as 50 to 250 $\mu$m, are used where a larger gap exists between the hot and cold substrates. In addition, combinations of different particle size materials can be used. Larger conductive filler particle size results in higher bulk conductivity. When at least some of the selected particles are capable of being plastically deformed during heat sink article attachment, these particle sizes can be even larger than the sizes mentioned above. A mixture of particle sizes can result in improved packing density which improves the resultant conductivity. Combinations of different thermally conductive fillers have been shown to provide equivalent thermal performance at reduced costs by substituting a portion of an expensive filler (for example, boron nitride) with a less expensive filler (for example, silicon carbide). Thermally conductive fillers often have anisotropic thermal conductivity along various crystal planes, so filler orientation via known methods can be used to enhance thermal performance.

The thermally conductive fillers may be present in the adhesive blends of the invention in an amount of at least 25 percent by weight of the total composition. In other embodiments of the invention, the thermally conductive filler is present in an amount of at least about 30 weight percent, at least about 40 weight percent, and in some embodiments of the invention, at least about 50 weight percent of the adhesive blend. In other embodiments, thermally conductive fillers may be present in the adhesive blends of the invention in a range of from 25 to 80 weight percent, 30 to 80 weight percent, 40 to 80 weight percent, 50 to 80 weight percent, or any range between 25 and 80 weight percent.

While the maximum amount of thermally conductive filler is selected based on the final properties (e.g., hardness, conformability, adhesion, and thermal conductivity) of the TIM, the thermally conductive filler is generally present in an amount less than about 80 weight percent. The TIM has a bulk thermal conductivity of greater than about 0.5 W-m/K, 0.6 W-m/K, or 0.8 W-m/K.

In certain applications, a fire retardant feature may be needed and/or may be required by applicable regulations. For example, TIMs used in electric or electronic applications may be directly exposed to electrical current, to short circuits, and/or to heat generated from the use of the associated electronic component or electrical device. Consequently, industry standards or regulations may impose conditions on the use of such TIMs that require qualifying tests be performed, such as burn tests, and the like. For electrical and electronics applications, the industry standard flammability test is Underwriters Laboratories (UL 94 "Standard for Tests for Flammability of Plastic Materials for Parts in Devices and Appliances"). It is preferable that the TIM will pass UL 94 V-2 flammability rating and in other embodiments, will pass a UL 94 V-0 flammability rating.

Fire retardants suitable for inclusion in the TIMs of the present invention include any type of fire retardant which are generally present in the film at a concentration of between about 5 weight percent and about 40 weight percent based on the total weight of the TIM. The fire retardants can be intumescent fire retardants and/or non-intumescent fire retardants. In other embodiments, the fire retardants are non-halogen containing and antimony-free. Examples of suitable fire retardants for use in the films described herein include those commercially available from Clariant Corporation of Charlotte, N.C., under the designation EXOLIT, including those designated IFR 23, AP 750, EXOLIT OP grade materials based on organophosphorous compounds, and EXOLIT RP grades of red phosphorus materials, non-halogenated fire retardants, such as FIREBRAKE ZB and BORGARD ZB, and FR 370 (tris(tribromoneopentyl) phosphate), available from Dead Sea Bromine Group, Beer Shiva, Israel. Examples of suitable fire retardants that also function as thermally conductive fillers include aluminum hydroxide and magnesium hydroxide.

Blends of one or more fire retardants and/or a synergist and/or smoke suppressants may also be used in the TIMs of the invention. Selection of the fire retardant system will be determined by various parameters, for example, the industry standard for the desired application, and by composition of the film polymer matrix.

The TIM may also include a number of other additives other than materials expressly excluded above. Examples of suitable additives include tackifiers (e.g., rosin esters, terpenes, phenols, and aliphatic, aromatic, or mixtures of aliphatic and aromatic synthetic hydrocarbon resins), pigments, reinforcing agents, hydrophobic or hydrophilic silica, calcium carbonate, toughening agents, fibers, fillers, antioxidants, stabilizers, and combinations thereof. The foregoing additional agents and components are generally added in amounts sufficient to obtain an article having the desired end properties, in particular, adhesive properties. For good conformability and surface contact, it is preferred that the TIM has a hardness less than about 60 Shore A.

Other embodiments of the invention include tapes and transfer tapes. Useful backing materials are thermally conductive. Such backing materials can be inherently thermally conductive or may contain an additive(s), such as those described above, to impart thermal conductivity. Examples of suitable backing materials include cellulosic materials, such as paper and cloth (woven and nonwoven); films, such as polyester, polyvinyl chloride, polyurethane, polypropylene, and nylon; scrims; and metal foils, such as aluminum foil. In another embodiment, a transfer tape is formed when the backing material is a release liner, wherein the release liner is not required to be thermally conductive. The release liner can be coated on one or both sides with a release coating. The backing may also be provided as multiple layers.

Multilayer articles can also be prepared by laminating layers together, or by layering extruded films as they exit their respective shaping orifices, with the use of some affixing means, such as an adhesive. Other techniques that can be used include extrusion coating and inclusion coextrusion, which is described in, for example, U.S. Pat. No. 5,429,856, incorporated herein by reference.

In accordance with the principals of the invention, the aforementioned thermally conductive skin adhesive layer or skin adhesive may be associated with the thermally conductive film by, for example, co-extruding the extrudable adhesive film composition with one or more extrudable skin adhesive compositions, as described in greater detail, below. The thermally conductive adhesive compositions are generally formulated and/or selected without fire retardant to provide an adhesive article, such as a tape wherein the film forms the substrate for the tape. The adhesive may be applied to a portion of the surface of the film (e.g., on one of the major surfaces thereof), leaving a portion of the surface (a second major surface) of the film as a substrate to support additional layers or structures. The skin adhesive can also be laminated to a surface of the film, or the film can be directly extruded or coated onto the skin adhesive after the skin adhesive has been applied to a release liner. The skin adhesive may employ multiple adhesive layers. Typically, the skin adhesive layer has a lower concentration of thermally conductive filler than the film layer so that adhesion can be maximized. In general, as the amount of thermally conductive filler increases, adhesive properties decrease.

Figure 4:
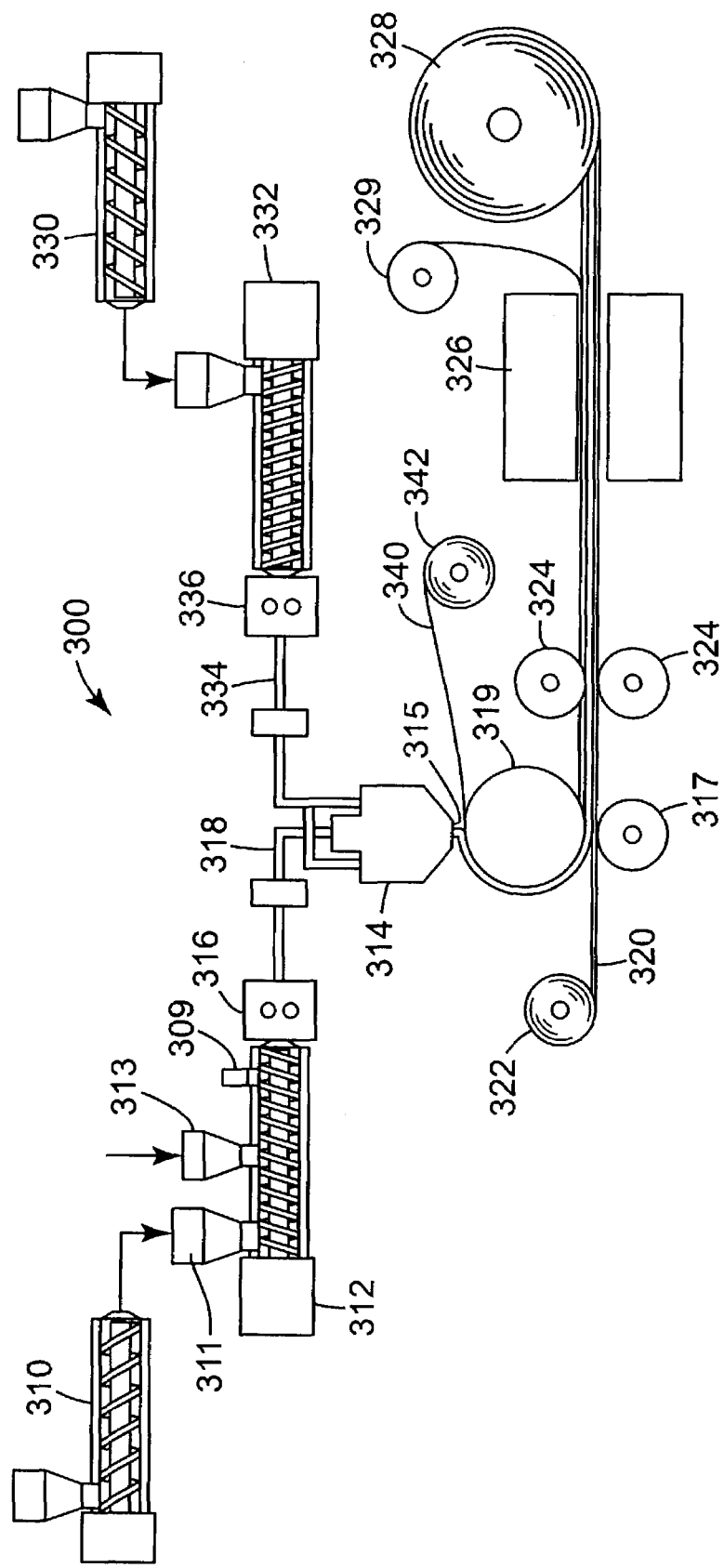
FIG. 4 is a schematic drawing of an extrusion processor for preparing articles according to the invention.
Figure 5:
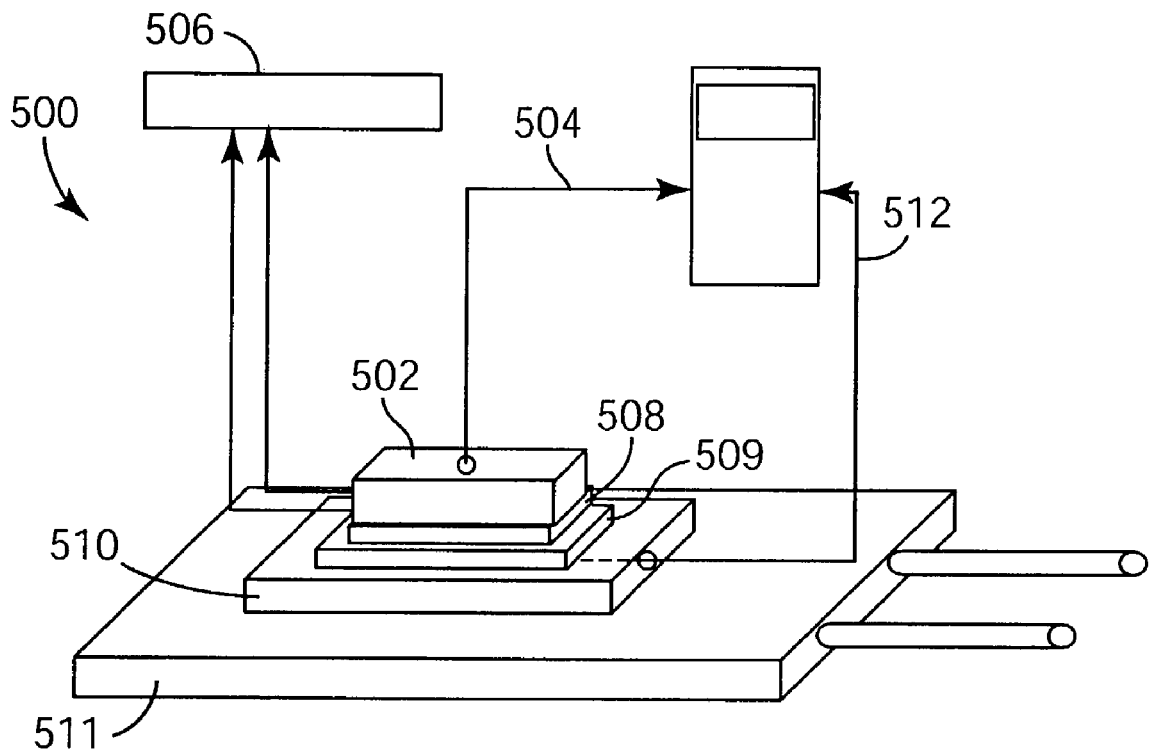
FIG. 5 is a schematic diagram of the thin-heater test apparatus used in the Examples.

Referring to FIG. 4, an extrusion process 300 is shown for preparing a TIM according to the invention. According to the process of the invention, pressures sensitive adhesive polymer is fed into a first extruder 310 (typically a single screw extruder) to soften and mix the polymer into a form suitable for extrusion. The resulting PSA polymer will be used to form the polymer matrix of the film. The polymer may be added to the extruder 310 in any convenient form, such as pellets, billets, packages, strands, pouches, and ropes.

Next, the thermally conductive filler, and when present, tackifying resin, fire retardant and other additives are fed to a second extruder 312 (e.g., typically a twin screw extruder). The hot melt polymeric PSA may be fed directly from the extruder 310 into second extruder 312 through the first port 311. The thermally conductive filler and other additives can be fed into any port of the second extruder and are typically fed into the second extruder 312 at entrance 313 which is typically at a point prior to the mixing/dispersing section of the extruder 312. Once combined, the polymer and additives are well mixed in extruder 312. The order of component addition and mixing conditions (e.g., screw speed, screw length, and temperature) are selected to achieve optimum mixing. It will be appreciated that if the hot melt polymeric PSA is provided in a form suitable for extrusion, the first extrusion step may be omitted and the PSA added directly to extruder 312. When incorporating high amounts of thermally conductive filler, it is desirable that the filler be added to the extruder through multiple addition ports (i.e., split feed, not shown) and that vacuum via port 309 be used to remove entrapped air. Entrapped air or voids lowers bulk thermal conductivity. The thermal interface material desirably contains less than about 5 percent void volume as determined by the test method described herein.

Once added, the thermally conductive filler, the PSA, and the optional fire retardant and/or microfiber forming material and/or other additives, are melt-mixed in the kneading zone to form an extrudable composition. The purpose of the melt-mixing step is to prepare an extrudable composition in which the thermally conductive filler, and other additives, if present, are distributed throughout the molten PSA. Typically, the melt-mixing operation uses one kneading block downstream from entrance 313 to obtain adequate mixing, although conveying elements may be used as well. Specific order of addition, zone temperatures, pressures, shear rates, and mixing times are selected based upon the particular chemical compositions being processed, and the selection of these conditions is within the skill of those practicing in the field.

Following melt-mixing, the extrudable composition is metered into one layer of a multilayer extrusion die 314 (e.g., a contact or drop die) through transfer tubing 318 using a gear pump 316. A single layer die could be used for single layer TIM constructions. The temperature within die 314 is maintained at substantially the same temperature as the temperature within transfer tubing 318. The volume within the die 314 is greater than the volume within the tubing 318 so that material flowing from the tubing 318 into the die 314 experiences a pressure drop to a pressure below that within transfer tubing 318. The pressure within the die 314 will continue to decrease as the extrudable composition approaches the exit port 315 of the die 314. The flow rate of PSA through the extruder 312 and the die 314 are maintained to keep the pressure in the die cavity low. The shape of die 314 may be chosen or fashioned to provide a desired shape for the finished thermally conductive film. Any of a variety of shapes may be produced, including continuous or discontinuous films.

If desired, the smoothness of one or both of the adhesive film surfaces can be increased by using nip roll 317 to press the film against a chill roll 319 after the article exits die 314, or by using smooth liners on each of the film surfaces and passing the composite article through a nip. Smoothness of the surface(s) is beneficial for good surface contact and adhesion. For optimal thermal conductivity, especially when bonding rigid substrates having large attachment areas, it is desirable that there is no air entrapment between the thermally conductive adhesive article and the substrate. Non-contact or non-bonded areas do not conduct heat and reduce overall thermal conductivity of the article.

In applications requiring improved adhesive properties, the thermally conductive film is combined with one or more skin adhesive layers; in other embodiments, one or more thermally conductive skin adhesive layers, applied to the outer surfaces of the film to form a TIM. The thickness of the skin adhesive layer is typically from about 0.025 mm (1 mil) to about 0.125 mm (5 mils); and in other embodiments, from about 0.025 mm (1 mil) to about 0.076 mm (3 mils). FIG. 4 shows such a co-extrusion process. Adhesive for the skin layer is introduced to the system by adding an adhesive resin/polymer to the extruder 330 (e.g., a single screw extruder) where the skin-layer adhesive is softened before it is fed to a second extruder 332 (e.g., typically a twin screw extruder) where the skin-layer adhesive is mixed with thermally conductive filler and other additives, if any. For such applications, the thermally conductive skin adhesive is formulated without adding other additives that diminish the adhesive properties or the tackiness of the adhesive. Although fire retardant materials are normally excluded from the formulation for the skin adhesive, small amounts of fire retardant may also be included within the skin adhesive at concentrations that are effective to impart fire retardant properties to the skin adhesive, while not significantly diminishing the tack of the skin adhesive. Specifically, it may be desirable to add a small amount of fire retardant to the skin adhesive in very thin (i.e., <0.635 mm (<0.025 inches)) thermally conductive fire retardant articles. The amount of fire retardant added to the skin adhesive is no greater than about 30 weight percent of the total weight of skin adhesive, and in other embodiments, no greater than about 20 weight percent, no greater than about 10 weight percent, and no greater than about 5 weight percent.

An extrudable thermally conductive skin adhesive composition is metered from the extruder 332 to the appropriate chambers of die 314 through transfer tubing 334 using a gear pump 336. The thermally conductive skin adhesive is co-extruded with the thermally conductive film through an exit port 315 on the die 314 so that the thermally conductive skin adhesive is applied directly to the outer surface of the extruded thermally conductive film. Where the thermally conductive film is provided having two major outer surfaces thereon, the thermally conductive skin adhesive may be applied to the thermally conductive film on either or both of the major outer surfaces. Co-extrusion methods for coating an article with adhesive are known to those in the art and need not be further explained here. Other methods can be used for applying the adhesive, such as for example, direct coating, spray coating, pattern coating, screen-printing, laminating, and the like.

If skin adhesive is applied to both of the major outer film surfaces, the resulting article is a three-layer article with a skin adhesive on each of the major surfaces of the thermally conductive film. For a three layer A/B/C construction (skin adhesive A/film layer B/skin adhesive C), another extruder and related equipment can be employed to permit another skin adhesive to be applied to the other major surface of the film. In this construction, the major surfaces of the film may be adhered to any of a variety of surfaces for use in applications where the thermally conductive properties of the film are desired and/or required. Moreover, the absence of fire retardant in the skin adhesive allows the thermally conductive film to be adhered to a surface or substrate with the maximum degree of adhesion provided by the particular skin adhesive used.

Suitable skin adhesives for use in the articles of the present invention include any adhesive that provides acceptable adhesion to a variety of polar and/or non-polar substrates. Pressure sensitive adhesives are generally acceptable. Suitable pressure sensitive adhesives include those based on acrylic polymers, polyurethanes, thermoplastic elastomers, such as those commercially available under the trade designation KRATON (e.g., styrene-isoprene-styrene, styrene-butadiene styrene, and combinations thereof) and other block copolymers, polyolefins, such as poly-alpha-olefins and amorphous polyolefins, silicones, rubber based adhesives (including natural rubber, polyisoprene, polyisobutylene, butyl rubber, etc.), as well as combinations or blends of these adhesives. The skin adhesive may contain tackifiers, polyphenylene oxide (PPO) polymer, fillers, microfiber forming materials, crosslinkers, antioxidants, dyes, colorants, as well as active components, such as an antimicrobial agent.

A group of pressure sensitive adhesives known to be useful as skin adhesives in the present invention are, for example, the acrylate copolymers described in, for example, U.S. Pat. No. Re. 24,906, incorporated herein by reference, and particularly a copolymer comprising a weight ratio of from about 90:10 to about 98:2 iso-octyl acrylate: acrylic acid copolymer. Also acceptable is a copolymer comprising a weight ratio of about 90:10 to about 98:2 2-ethylhexyl acrylate: acrylic acid copolymer, and a 65:35 2-ethylhexyl acrylate:isobornyl acrylate copolymer. Useful adhesives are described in, for example, U.S. Pat. Nos. 5,804,610 and 5,932,298, both of which are incorporated herein in their entireties by reference thereto. Blends of acrylic adhesives and rubber based adhesives may also be used, such as is described in, for example, WO 01/57152, which is incorporated in its entirety herein by reference thereto.

A release liner 320 may be applied to the skin adhesive layer or layers disposed on either or both of the major surfaces of the thermally conductive adhesive film. The liner 320 can be dispensed from a feed roll 322. Suitable materials for liner 320 include silicone release liners, release coated polyester films (e.g., polyethylene terephthalate films), and polyolefin films (e.g., polyethylene films). The liner and the thermally conductive adhesive film are then laminated together between nip rollers 324.

Optional release liner 340 can be added to the opposing surface of the film by positioning optional second feed roll 342 near one of the nip rolls 324. The second release liner 340 may be the same as or different from the release liner 320. Moreover, the second release liner 340 may be provided with a layer of an adhesive coated or applied to one surface of the release liner 340. In this manner, a second skin adhesive layer (not shown) may be applied to the second major surface of the film material. The second skin adhesive layer may be the same as or different from the aforementioned co-extruded adhesive. Typically, the skin adhesive layers will comprise thermally conductive pressure sensitive adhesives. Release liner 320 may also be provided with a layer of a skin adhesive coated or applied to one of its surfaces.

Variations to the foregoing process and to the equipment used will be known to those skilled in the art, and the invention is not limited by the described apparatus of FIG. 4 herein. Other methods for the manufacture of multilayered film/adhesive constructs are to be considered within the scope of the invention.

Following lamination, the TIM is optionally exposed to radiation from E-beam radiation source 326 to crosslink the film for improved cohesive strength. For thicker films, it may be necessary to E-beam the TIM through both major surfaces to sufficiently penetrate the material to induce more complete crosslinking. Following E-beam exposure, the optional second release liner 340 can be removed from the TIM using a take-up roll 329, and the laminate is rolled up onto a take-up roll 328.

Gamma radiation and other sources of radiation may be used as long as the radiation is energetic enough to penetrate the thickness of the film to initiate and to sufficiently crosslink the thermally conductive adhesive throughout its thickness. Combinations of radiations may be used. For thicker films, it may be necessary to irradiate the film through both major surfaces to sufficiently penetrate the material to induce more complete crosslinking. Alternatively, the TIM could be gamma irradiated after being wound into a roll.

The release liners are typically coated with release agents, such as fluorochermicals or silicones. For example, U.S. Pat. No. 4,472,480 describes low surface energy perfluorochemical liners. Suitable release liners include papers, polyolefin films, or polyester films coated with silicone release materials. Polyolefin films may not require release coatings when used with acrylic based pressure sensitive adhesives. Examples of commercially available silicone coated release liners are POLYSLIK™ silicone release papers (available from James River Co., H. P. Smith Division, Bedford Park, Ill.) and silicone release papers supplied by DCP-Lohja (Dixon, Ill.) now known as Loparex, Inc. (Willowbrook, Ill.). A particular release liner that is known by the designation 1-60BKG-157, a super calendared Kraft paper with a water-based silicone release surface, is available from DCP- Lohja. Other types of E-beam stable, contaminant free release liners are also useful in the invention, such as those described in, for example, pending U.S. Patent Publication No. 02-0155243-A1, assigned to the assignee of this application, and incorporated in its entirety herein by reference.

To provide stretch release properties and to further reinforce the TIMs of the invention, the thermally conductive film, the skin adhesive or both the film, and the skin adhesive will include microfiber forming materials that form viscoelastic and/or elastic microfibers in situ during the manufacturing process described herein. The individual microfibers are individual, substantially continuous, and dispersed throughout the adhesive polymer matrix and oriented in the machine direction of the film. It has been found that suitable microfibers include those formulated according to the teachings of pending U.S. Patent. Publication No. 02-0187294-A1, incorporated in its entirety herein by reference thereto. In TIMs of the invention, the microfibers are unbroken for at least about 0.5 centimeters (cm) in the machine direction; in other embodiments, at least about 2 cm, about 5 cm, or about 8 cm. In another aspect, the substantially continuous microfibers generally have a maximum diameter of about 0.05 to about 5 micrometers, typically from about 0.1 to about 1 micrometer and the aspect ratio (i.e., the ratio of the length to the diameter) of the substantially continuous microfibers is greater than about 1000.

The foregoing co-extrusion process can be conducted so that a one or two-layer thermally conductive adhesive article is produced, or to produce articles having three or more layers (e.g., 10-100 layers or more) by equipping die 314 with an appropriate feed block, or by using a multi-vaned or a multi-manifold die. Multilayered articles can also be prepared by laminating additional layers, as described above, to the film, or to any of the co-extruded polymer layers after the article exits die 314. Other techniques which can be used include pattern coating. The layer(s) in the articles of the invention can be thick, i.e., greater than or equal to 0.25 mm (0.010 inches) or thin (i.e., <0.25 mm (0.010 inches)).

The TIMs of the invention may be used in a variety of applications, including aerospace, automotive, electronic, and medical applications. The TIMs of the invention are typically used to join processors and components to heat dissipating devices (for example, heat sinks and spreaders). The properties of the articles may be tailored to meet the demands of the desired applications. Specific examples of applications include adhesive tapes, pads, or sheets, vibration damping articles, tape backings, gaskets, spacers, and sealants. TIMs of the invention may be cut, for example, die cut, to any dimension.

The features of the embodiments of the invention are further illustrated in the following non-limiting examples.

EXAMPLES

These examples are merely for illustrative purposes only and are not meant to be limiting on the scope of the appended claims. All parts, percentages, ratios, etc. in the examples and the rest of the specification are by weight unless indicated otherwise.

In the test methods and examples below, the sample dimensions (typically the length) are approximate except for the width wherein the width was measured to the accuracy of the cutting tool.

Test Methods
Density and Void Volume

Density was determined according to ASTM D 792-86 "Standard Test Method for Density and Specific Gravity (Relative Density) of Plastics by Displacement." Samples were cut into approximately 2.54 cm×2.54 cm (1 inch (in)×1 inch (in)) specimens and weighed on a high precision balance, available as Model AG245 from Mettler-Toledo, Greifensee, Switzerland. The volume of each sample was obtained by measuring the mass of water displaced at room temperature (23° C.+/−1° C.). The buoyancy of each sample was measured in grams using a special attachment for the balance. The density ($D_{meas.}$) of the sample was taken to be its mass divided by its buoyancy, assuming the density of water at 23° C. to be 1 g/cc.

The theoretical density ($D_{theor.}$) of the composition was determined from the following:

$$D_{theor.} \text{ of composition} = (\text{weight percent adhesive component} \times$$
$$D_{meas.} \text{ of adhesive component}) +$$
$$(\text{weight percent first filler component} \times$$
$$D_{theor.} \text{ of first filler component}) +$$
$$(\text{weight percent second filler component} \times$$
$$D_{theor.} \text{ of second filler component}) +$$
$$(\text{weight percent third filler component} \times$$
$$D_{theor.} \text{ of third filler component}) \text{ etc.}$$

And from this, percent void volume was calculated from:

$$\% \text{ Void Volume} = \left(1 - \frac{D_{meas.} \text{ of composition}}{D_{theor.} \text{ of composition}}\right) \times 100$$

Viscosity

The changes in viscosity were measured using Rheometrics Dynamic Analyzer RDA II, available from Rheometrics, Inc., Piscataway, N.J. The adhesive was put in 25 mm diameter parallel plates with the thickness of 1 mm. The data were plotted as complex viscosity versus temperature and shear rate at 180° C. The viscosity at a frequency of 1 radian/second was reported.

Hardness Test

The thickness of an article (about 3.81 cm (1.5 in) by 2.54 cm (1.0 in)) sample was measured and recorded. The sample was then laminated to a clean, dry glass panel taking care to avoid trapping air bubbles between the sample and the glass. Additional pieces of article sample were laminated to the first article in the same manner until a total thickness of at least 0.34 cm (0.135 in) was achieved. Using a Shore A Hardness Tester (Model CV Stand and Durometer Type A ASTM D2240 Gauge, available from Shore Instrument Mfg. Co. Inc., Freeport, N.Y.), the initial hardness reading from the instrument was taken at three locations on each sample piece and those values were averaged.

Static Shear Strength Test

A 2.54 cm (1.0 in) wide by about 3.81 cm (1.5 in) long sample was cut from the article to be tested and pressed onto a solvent-washed (one wash of acetone followed by three washes of heptane), dry, 0.508 cm (2 in) wide by 7.62 cm (3 in) long, Type 304 stainless steel substrate panel and the sample was centered on one end of the panel. An about 10.16 cm (4 in) long by about 3.175 cm (1.25 in) wide by 0.0025 cm (0.001 in) thick sheet of primed polyester film was adhered to the sample by rolling down the primed side of the polyester film onto the sample using a 2 kg (4.5 lb) hard rubber roller, with two passes in each direction, taking care not to trap air bubbles between the film and the sample, with approximately 5.1 cm (2 in) of the polyester film extended off the panel to serve as a tab. The laminate on the panel was then cut to a 2.54 cm (1.0 in) length so that the resultant bonded area was 2.54 cm×2.54 cm (1.0 in×1.0 in). The 5.1 cm (2 in) tab was then folded around a triangular clip, wrapped with masking tape, and stapled so that a weight could be attached to the test specimen. A 1000 g weight was used to test samples at room temperature and a 500 g weight was used to test samples at 70° C. (158° F.). The sample thus prepared was allowed to dwell at room temperature and approximately 50% relative humidity for approximately 24 to 72 hours. The test specimen was then placed in a Static Shear standard fixture having a 2 degree angle back slant. The fixtured specimen was then either tested at room temperature (about 22° C.) or in a forced air oven set at 70° C. (158° F.). The elevated temperature test specimen was then given a 10 minute warm up period before attaching the 500 g weight. The test was run until the test specimen failed or 10,000 minutes elapsed. Failure time was recorded.

Tensile Break Strength and Elongation Test (Method I)

Tensile and elongation was determined according to ASTM D412-98a "Standard Test Methods for Vulcanized Rubber and Thermoplastic Elastomers-Tension." A silicone release liner was applied to the exposed surface of the article that already had a liner on one side. A sample was cut using Die E in the machine direction from the article to be tested to form the test specimen. Sample thickness was measured in the center of each specimen using an AMES gauge having a force of 0.1 kg (3.5 oz) and a 0.0635 cm (0.25 in) diameter foot. The tensile tester was set up with the following conditions:

Jaw Gap: 8.89 cm (3.5 in)
Crosshead Speed: 51 cm/min (20 in/min)
Load cell: 45 kg (100 lb)

The initial gauge length was set at 8.89 cm (3.5 in) by separating the instrument clamping jaws to this length and the sample was centered horizontally between the jaws so that an approximate equal length of sample was held by each jaw. The sample was tested at a crosshead speed of 51 cm/min (20 in/min) until the sample broke or reached the maximum extension of the machine (101.6 cm (40 in)). The tensile strength in pounds (and later converted to kilograms) and elongation distance were recorded. The percent elongation was determined by dividing the elongation distance by the initial gap distance times 100. Eleven replicates were tested, except where noted, and averaged to provide the thickness, Peak Load, Peak Stress, Percent (%) Strain at Peak Stress, Break Load, % Strain at Break, Energy at Break, and Modulus.

Tensile Break Strength and Elongation (at Break) Test (Method II)

A silicone release liner was applied to the non-liner side of the article. A 1.27 cm (0.5 in) wide by about 12.7 cm (5 in) long sample was cut in the machine direction from the article to be tested to form the test specimen. One liner was removed and a 2.54 cm (1.0 in) length was measured and marked in the center of test specimen to provide the initial gap distance. A 2.54 cm (1 in) wide by about 7.62 cm (3 in) piece of masking tape was placed across the TIM by positioning the tape edge on the both marks so that the 2.54 cm (1.0 in) long section that was marked off did not have tape covering it. The other liner was then removed and masking tape was wrapped completely around the article, making sure to keep the masking tape aligned across the article. The tape was used to prevent the sample from adhering to the INSTRON jaws and prevent the sample from breaking at the point where it was clamped by the jaws. The INSTRON was set up with the following conditions:

Jaw Gap: 2.54 cm (1.0 in)
Crosshead Speed: 25.4 cm/min (10 in/min)

The test specimen was then positioned in the INSTRON jaws so that the jaws lined up with the edge of the masking tape. The sample was tested at a crosshead speed of 25.4 cm/min (10 in/min) until the sample broke. The tensile break strength or peak load was recorded in pounds (and later converted to kilograms) and elongation distance was recorded. The percent elongation at break was determined by dividing the elongation distance by the initial gap distance times 100. One specimen per sample was tested.

90-Degree Peel Adhesion Test

A 25.4 mm (1 in) or a 12.7 mm (0.5 in) wide by about 127 mm (5 in) long sample was cut from the article to be tested. The 25.4 mm (1 in) wide sample was laminated to an about 152.4 mm (6 in) long by about 28.6 mm (1.125 in) wide by 0.025 mm (0.001 in) thick primed polyester film by rolling down the article onto the primed side of the polyester film, taking care not to trap air bubbles between the film and the article. The 12.7 mm (0.5 in) wide sample was similarly laminated to an about 152.4 mm (6 in) long by about 15.8 mm (0.625 in) wide by 0.025 mm (0.001 in) thick primed polyester film. The laminate was then positioned on either a solvent-washed (one wash of acetone followed by three washes of heptane), dry, 51 mm (2 in) wide by about 127 mm (5 in) long, Type 6061-T6 alloy bare standard aluminum panel or a solvent-washed (three washes of isopropyl alcohol), dry 51 mm (2 in) wide by about 127 mm (5 in) long polypropylene panel, so that the laminate was centered on the panel with a portion of the laminate extending off the panel to serve as a tab. The laminate was rolled down onto the panel using a 2 kg (4.5 lb) hard rubber roller, with one pass in each direction. Care was taken not to trap bubbles between the panel and the laminate. The sample thus prepared was allowed to dwell at room temperature (about 22° C.) for about 24 hours. Then the sample was tested at room temperature (about 22° C.) for 90 Degree Peel Adhesion by Method A (for polypropylene panels) or Method B (for aluminum panels) described below.

Method A: The sample was tested at crosshead speed of 30 cm/min (12 in/min) using an IMASS tester fitted with a 4.5 kg (10 lb) load cell. The peel value obtained from the first 0.51 cm (0.2 in) length of peel was ignored. The peel value of the next 5.08 cm (2 in) or "peel area" was recorded. The values reported were an average of the integrated peel adhesion values of three replicates.

Method B: The sample was tested at crosshead speed of 30 cm/min (12 in/min) using a SINTECH 5/GL Instron tester fitted with a 45 kg (100 lb) load cell. The peel value obtained from the first 1.27 cm (0.5 in) length of peel was ignored. The peel value of the next 89 mm (3.5 in) or "peel area" was recorded. The values reported were an average of the integrated peel adhesion values of three replicates.

Stretch Release Test

A 12.5 mm (0.5 in) wide by 127 mm (5 in) long strip was cut from the test sample such that the length was cut in the machine direction of the sample.

One strip was laminated to a 50.8 mm (2 in) wide×127 mm (5 in) long aluminum or glass panel such that the strip was approximately 0.635 cm (0.25 in) from one of the long edges of the panel and approximately 25.4 mm (1.0 in) of the strip extends beyond the end of the panel. Care was taken to ensure maximum wet-out of or contact between the strip and the panel. It was desired that 100% contact be achieved.

Similarly, a strip from a different example was laminated along the other edge of the glass or aluminum panel.

Then a second like panel (i.e., aluminum to aluminum or glass to glass) was laminated directly over the first panel making sure not to entrap air bubbles between the strips and the second panel. The bonded sample was allowed to dwell for between 24 hours and 72 hours at room temperature (about 22° C.).

The free end of the test strips were pulled by hand at a speed of about 30 cm/min (about 12 in/min) in a direction substantially parallel to the panels to initiate stretch release removal until the bond failed. Only the glass panels were visually examined for the presence of residue and the failure mode was recorded. A sample was rated as "Pass" if there was complete removal from the panel. A sample was rated as "Fail" if the sample could not be completely removed.

Thermal Impedance Measurement

The thermal impedance of single layers of the disclosed invention was measured according to ASTM C-114 Test Method "Steady-State Thermal Transmission Properties by Means of the Thin-Heater Apparatus."

A diagram of the Thin-Heater Apparatus 500 is shown in FIG. 4.

A small resistor 502 was used as the thin-heater. The resistor used was a 10 ohm resistor in TO-220 package with an area of 0.806 cm² (0.125 in²) (such as Caddock Electronics MP930). A small hole was drilled through the back of the resistor into which a thin-wire thermocouple 504 was placed to measure the hot side temperature, $T_h$.

A know amount of power, Q, was supplied from the precision power supply 506 (such as Hewlett Packard E3611A) by setting the current and voltage (Power=current× voltage). The sample to be tested 508 was placed onto a disposable test surface 509 and between the thin-heater and the cold aluminum test block 510, cooled by running cold water through a cooling block 511. The cold test block had a thermocouple 512 for measuring the cold side temperature, $T_c$. The resistor was powered up and the temperature of the resistor was allowed to come to equilibrium. Temperatures $T_h$ and $T_c$ were recorded and the impedance and conductivity calculated according to ASTM C 1114 using the following relationships:

A=area of thin heater

Power, $Q$=voltage×current supplied

Rate of heat flux, $q=Q/A$

Delta $T=T_h-T_c$

Thermal resistance $(R)$=Delta $T/q$

Thermal impedance $(Z_{uncorr.})=R \times A$

The thermal impedance was corrected for any heat loss off the top (horizontal) surface of the resistor (but not the sides of the sample) and reported as $Z_{corr.}$ $Z_{corr.}=Z_{uncorr.}$-[convective heat loss value of the resistor×(surface temperature $T_h$ of the resistor-room temperature)]

where the convective heat loss value for TO-220 type resistor=0.011 Watts.

Further discussion can be found in the article "Factors Affecting Convection Heat Transfer", *Heat Transfer*, Watlow Education Series, Book One, 1995, pages 16-17. The convection heat loss value of the resistor is taken from FIG. 17 on page 17 of the aforementioned book and is based upon the size of the test resistor.

Thermal Bulk Conductivity Measurement

An impedance plot method was used to calculate bulk thermal conductivity (k).

The corrected thermal impedance ($Z_{corr.}$) was measured according to the above test method for samples of different thickness. The samples were obtained by either extruding material at different thicknesses or by combining multiple layers of a single sample to obtain different thicknesses. The data were then plotted allowing for a finite value of the interfacial impedance. This plot method can be expressed as an equation:

$Z_{corr.}=Z_{interface}+t/k$

Figure 6:
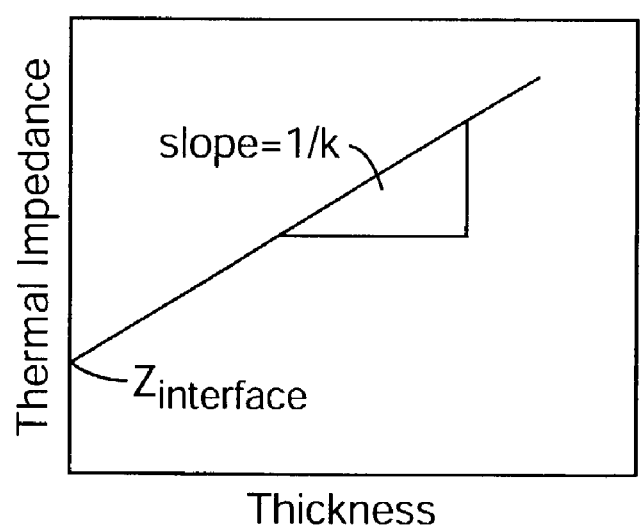
FIG. 6 is a plot of thermal impedance ($Z_{corr.}$) versus thickness (t) used to calculate bulk thermal conductivity in the Examples.

FIG. 6 shows a plot of thermal impedance ($Z_{corr.}$) versus thickness (t). The plot resulted in a line having a slope=1/k and an intercept at t=0 equal to $Z_{interface}$. Thermal bulk conductivity (k) was then calculated from slope of the line of corrected thermal impedance values.

Materials Used in the Examples

| Component | Trade Name | Description | Source |
|---|---|---|---|
| Adhesive | | | |
| 2-EHA | 2-Ethyl hexylacrylate | acrylate monomer | BASF Corp, Mt. Olive, NJ |
| AA | acrylic acid | acrylate monomer | BASF Corp. |
| IOTG | isooctyl thioglycolate | chain transfer agent | BASF Corp. |
| KRATON D1107 | Kraton ™ D1107 | styrene-isoprenestyrene linear thermoplastic elastomer (nominal molecular weight of 229,000) | Kraton Polymers U.S. LLC, Houston, TX |
| Shellflex 371N | Shellflex ™ 371N | refined petroleum oil | Shell Lubricants, Houston, TX |
| Irganox 1010 | Irganox ™ 1010 | antioxidant | Ciba Specialty Chemicals Corp, Tarrytown, NY |
| Wingtack Plus | Wingtack ™ Plus | tackifying resin (nominal number average molecular weight of 1070) | Goodyear Tire & Rubber Co, Chemical Division, Akron, OH |
| IRG 651 | Irgacure ™ 651 | 2,2-dimethoxy-2-phenylacetophenone | Ciba Specialty Chemicals Corp |
| VA-24 film | VA-24 film | 0.0635 mm thick heat sealable, ethylene vinyl acetate copolymer film having 6% vinyl acetate | CT Film of Dallas, TX |

-continued

Materials Used in the Examples

| Component | Trade Name | Description | Source |
|---|---|---|---|
| Filler | | | |
| Blendex HPP857M | Blendex ™ HPP857M | polyphenylene ether, powder, Tg 165° C., Mw 6300, specific gravity 1.02 g/cm³ | GE Specialty Chemicals, Inc, Morgantown, WV |
| Exact 3040 | Exact ™ 3040 | ethylene-based hexene copolymer, nominal tensile yield strength (MD) 5.4 MPa (780 psi), tensile break strength (MD) 51.6 MPa (7490 psi), elongation at break (MD)460%, MI 16.5, density 0.900 g/cm³, peak melting temperature 96° C. (205° F.) | ExxonMobil Chemical Company, Houston, TX |
| BN | boron nitride | thermally conductive filler, hexagonal form, theoretical density 1.80 | Advanced Ceramics Corporation, Cleveland, OH; now known as GE Advanced Ceramics |
| Al(OH)₃ | Martinal ON 320 | aluminum hydroxide, particle size 20 microns, theor. Density 2.40 | Albemarle Corporation, Baton Rouge, LA |
| Mg(OH)₂ | magnesium hydroxide | thermally conductive filler, theoretical density 2.40 | Albemarle Corporation |

Example 1

Acrylic thermal interface compositions were prepared using varying amounts of thermally conductive fillers.

Preparation of Pressure Sensitive Adhesive A (PSA-A):

A pressure sensitive adhesive composition was prepared by mixing 95 parts 2-EHA, 5 part AA, 0.15 parts IRG 651, and 0.02 parts IOTG.

The composition was placed into VA-24 film packages measuring approximately 100 mm by 50 mm by 5 mm thick, immersed in a water bath and exposed to UV radiation as described in, for example, U.S. Pat. No. 5,804,610. Viscosity of PSA-A was about 3981 Poise (P) as tested according to test method above. This adhesive is believed to have a weight average molecular weight ($M_w$) of about 700,000 to about 1,200,000. The density of PSA-A was 0.98 g/cc.

Preparation of Thermal Interface Material:

PSA-A was fed to the feed port in barrel section 1 of a 30 mm co-rotating twin screw extruder with four ports (Werner Pfleider) via a 51 mm single screw extruder (Bonnot extruder). The temperature for all zones in the Bonnot extruder was set at 149° C. (300° F.). Thermally conductive fillers as specified in Table 1 (parts by weight as specified in Table 1 per 100 parts by weight of PSA-A plus thermally conductive filler) were added as dry solids in one portion to a feed port in barrel section 5 of the co-rotating twin screw extruder that was operating at a screw speed set point of 200 rpm (actual speed about 177 rpm) with a total flow rate of thermally conductive filler and pressure sensitive adhesive, as prepared above, of about 3.18 kilograms/hour (kg/hr) (7 pounds/hour (lb/hr)). In all six temperature zones in the twin screw extruder, the temperature was set at 93.5° C. (200° F.). A vacuum (in a range from about −77.9+/−10.2 newtons/sq. meter (N/m²) (−23+/−3 inches of mercury (Hg)) was applied through a port in barrel section 9. The temperature in the three extruder adapters was 113° C. (235° F.) and the flexible hose at the exit end of the extruder were all set at 113° C. (235° F.). The flow rate was controlled with a heated Zenith melt pump, nominally 10.3 cc/rev, set at 113° C. (235° F.).

The extrudate was pumped via the heated hose to a single layer 15.24 cm (6 in) wide drop die with a gap of about 0.114 cm (0.045 in) and set at 149° C. (300° F.). The line speed was adjusted to provide the target thickness as specified in Table 1. The extruded sheet was cast into a nip formed by two chill rolls (one metal and one rubber), between two silicone coated polyester release liners. The temperature of the chill rolls was set at 7.5° C. (45° F.). Each liner was a 0.051 mm (0.002 in) thick two sided, silicone-coated polyester liner, having different release materials (identified as 5035 and 7200) on each side, available from DCP-LOHJA Inc., Willowbrook, Ill., as 2-2PESTR(P2)-5035 and 7200. The extruded sheet contacted the 7200 side of one liner and the 5035 side of the other liner. The liner having 7200 release material in contact with the extruded sheet was removed and the resulting article was wound into a roll for subsequent crosslinking.

TABLE 1

| Samples | Conductive Filler | Weight Percent Conductive Filler | Target Thickness, cm (mils) | Measured Thickness, cm (mils) |
|---|---|---|---|---|
| 1 | BN | 40 | 0.0254 (10) | 0.0282 (11.1) |
| CE 1 | Al(OH)₃ | 40 | 0.0508 (20) | 0.0546 (21.5) |
| CE 2 | Al(OH)₃ | 50 | 0.0508 (20) | 0.0518 (20.4) |
| CE 3 | Mg(OH)₂ | 50 | 0.0508 (20) | 0.0544 (21.4) |

Two approximately 0.46 meter (m) (18 in) long pieces were cut from the above sample roll. A polyester liner, 2-2PESTR(P2)-5035 and 7200, was carefully laminated to the uncovered side (Side 2) of each piece with the 7200 silicone coated side contacting the uncovered side (Side 2). The extruded sheets with liners on both sides was then subjected to gamma radiation as described below.

Samples subjected to gamma radiation were passed through a gamma processing unit (Research Loop of Panasonic Industrial Irradiator JS 7500, Cobalt 60 Wet Storage, available from M. D. S. Nordion, Kanota, Ontario, Canada). Each piece received a measured gamma dose between 31.6 to 36.4 kilograys (kGy) (target dose=30 kGy).

The resultant article was then tested for physical properties, and adhesive performance properties according to the Test Methods outlined above. The Thermal Bulk Conductivity for Example 1 and Compartaive Examples 1-3 was NT, 0.55, 0.58, and 0.70 Watts/meter-K respectively. Results are given in Table 2.

TABLE 2

| | Density, g/cm³ (measured/ theoretical) | % Void Volume | Hardness | Peel Adhesion, kN/m (oz/in) | | Static Shear, Minutes | | Impedance, °C.-cm²/W (°C.-in²/W) | |
|---|---|---|---|---|---|---|---|---|---|
| | | | | Al | PP | 22° C. | 70° C. | $Z_{uncorr.}$ | $Z_{corr.}$ |
| 1 | 1.266/ 1.30 | 2.62 | 34 | 0.508 (46.4) | 0.186 (17.0) | 10,000+ | 10,000+ | 6.45 (1.00) | 6.90 (1.07) |
| CE 1 | 1.057 (b)(c)/ 1.55 | 31.8 | 14 | 0.583 (53.3) | 0.287 (26.2) | 10,000+ | 10,000+ | 14.645 (2.27) | 17.16 (2.66) |
| CE 2 | 1.159 (b)(c)/ 1.69 | 31.42 | 18 | 0.508 (46.4) | 0.175 (16.0) | 10,000+ | 10,000+ | 11.355 (1.76) | 12.71 (1.97) |
| CE 3 | 1.317 (b)/ 1.69 | 22.07 | 33 | 0.408 (37.3) | 0.049 (4.5) | 10,000+ | 10,000+ | 11.677 (1.81) | 13.10 (2.03) |

(a) NT = not tested
(b) large voids in samples (filler added via single feed port)
(c) Al(OH)₃ released water at the die temperature Example 2-10

Acrylic thermal interface compositions were prepared using various thermally conductive fillers. Each composition was coated at several thicknesses.

Preparation of Pressure Sensitive Adhesive B (PSA-B):

A pressure sensitive adhesive composition was prepared by mixing 97 parts 2-EHA, 3 parts AA, 0.15 parts IRG 651, and 0.01 parts IOTG. The composition was placed into packages, immersed in a water bath, and at the same time exposed to ultraviolet radiation as described above for Example 1. Viscosity of PSA-B was about 2215 P as tested according to test method above. This adhesive was believed to have a weight average molecular weight ($M_w$) of about 800,000 to about 1,300,000. The density of PSA-B was 0.98 g/cc.

Preparation of Thermal Interface Composition:

PSA-B was fed at a feed rate of 4.55 kg/hr (10 lb/hr) via the Bonnet extruder of Example 1 into barrel 1 of a co-rotating twin screw extruder (40 mm Berstorff ZE-40, L/D=40, 10 barrels). All temperature zones of the Bonnot extruder were set at 149° C. (300° F.) except for Zone 1, which was set at 135° C. (275° F.). The thermally conductive fillers were fed as dry solids into barrels 2 and 4 of the twin screw extruder using gravimetric feeders (K-Tron model T20, K-Tron, Pitman, N.J.). Table 3 below provides filler feed rates. This split feed arrangement was used to successfully obtain the required loading levels of the low bulk density filler. In addition, the vertical drop distances were kept as short as possible to avoid excess air entrapment. Each extrusion screw was composed of self-wiping and square channel double-flighted conveying elements of varying pitch (60 mm, 40 mm, and 30 mm). The screws also contains 5-paddled kneading blocks, 50 mm in length, offset in three different arrangements: (1) 45 degrees in a forward (LI) direction, (2) 45 degrees in a reverse (RE) direction, or (3) 90 degrees in a neutral pattern. The first 370 millimeters of the screw are composed of forward conveying, self-wiping elements (pitches of 30 and 60). The first kneading section was located between 370-520 mm of the screw and consists of a forward, neutral, and reverse kneading block. A conveying section (520-770 mm) and another kneading segment (770-920 mm) follow. This kneading section was composed of two forward blocks followed by a reverse block. The remainder of the screw (920-1600 mm) was composed of self-wiping and square channel forward conveying elements of various pitches, generally following a declining trend in pitch (60 mm, 40 mm, 30 mm). The twin screw extruder was operated with a screw speed set point of 200 rpm (actual speed about 200 rpm) at a temperature of 125° C. (257° F.) in all zones. A vacuum (about −94.81 kN/m2 (−28 inches of mercury (Hg)) was applied through an open port in Zone 8 to remove any volatiles and/or moisture. As noted in the screw design, large pitch forward conveying elements were used in the vacuum area to provide a lower degree of fill thereby maximizing polymer surface area. The extrudate was pumped via a heated Normag melt pump, nominally 10.3 cc/rev, set at 125° C. (257° F.) through a 1.905 cm (0.75 in) diameter stainless steel neck tube set at 154.4° C. (310° F.) to the middle/center layer of a 4.17 cm (10 in) wide 3-layer Cloeren drop die having a 0.102 cm (0.040 in) gap (available from The Cloeren Company, Orange, Tex.). The die temperature was set at 177° C. (350° F.). The line speed was adjusted to provide the target thickness as specified in Table 3.

TABLE 3

| Ex. No. | Conductive Filler | Weight Percent Conductive Filler | Zone 2 Feed Rate, kg/hr (lb/hr) | Zone 4 Feed Rate, kg/hr (lb/hr) | Target Thickness, cm (mils) | Measured Thickness, cm (mils) |
|---|---|---|---|---|---|---|
| 2 | BN | 30 | 0.973 (2.14) | 0.973 (2.14) | 0.0508 (20) | 0.0635 (25) |
| 3 | BN | 30 | | | 0.0762 (30) | 0.0838 (33) |
| 4 | BN | 30 | | | 0.1016 (40) | 0.119 (47) |

TABLE 3-continued

| Ex. No. | Conductive Filler | Weight Percent Conductive Filler | Zone 2 Feed Rate, kg/hr (lb/hr) | Zone 4 Feed Rate, kg/hr (lb/hr) | Target Thickness, cm (mils) | Measured Thickness, cm (mils) |
|---|---|---|---|---|---|---|
| 5 | BN | 40 | (3.33) | (3.33) | 0.0508 (20) | 0.0660 (26) |
| 6 | BN | 40 | | | 0.0762 (30) | 0.0813 (32) |
| 7 | BN | 40 | | | 0.1016 (40) | 0.119 (47) |
| 8 | BN | 50 | 1.82 (4.0) | 2.73 (6.0) | 0.0508 (20) | 0.0533 (21) |
| 9 | BN | 50 | | | 0.0762 (30) | 0.0762 (30) |
| 10 | BN | 50 | | | 0.1016 (40) | 0.0635 (25) |

The extruded sheet was cast onto a two side, silicone coated, polyester liner in contact with a chilled cast roll. The temperature of the cast roll was set at 7.5° C. (54° F.). The resulting article was wound into a roll for subsequent crosslinking.

Eight approximately 0.46 m (18 in) long pieces were cut from the above sample roll. Liner 2-2PESTR(P2)-5035 and 7200, was carefully laminated to the uncovered side (Side 2) of each piece with the 7200 silicone coated side contacting the uncovered side (Side 2). The extruded sheet with liners on both sides was then subjected to either E-beam or gamma radiation as described below.

E-Beam: Two of the extruded sheets with liners on both sides were then passed through an E-beam processing unit (ESI Electro Curtain) operating at an accelerating voltage of 300 keV, one pass on each side at a measured E-beam dose of 9 megarads (Mrads) on each side.

Gamma: Samples were subjected to gamma radiation and were passed through the gamma processing unit of Example 1. Two sample pieces each received a target (actual measured) gamma dose of between about 30 kGy (31.6-31.7 kGy), 45 kGy (44.4-45.9 kGy), or 60 kGy (58.8-59.7 kGy).

The resultant articles were then tested for physical properties, and adhesive performance properties according to the Test Methods outlined above. Results are given in Tables 5 and 6. The test method used for Table 5 was Tensile Break Strength and Elongation Test (Method I).

TABLE 4

| Ex. No. | Density, g/cm³ (measured/ theoretical) | Hardness | % Void Volume | Radiation Type and Target Amount | Peel Adhesion, kN/m (oz/in) Al | Static Shear, Minutes 22° C. | 70° C. | Impedance, ° C.-cm²/W (° C.-in²/W) $Z_{uncorr.}$ | $Z_{corr.}$ | Thermal Bulk Conductivity |
|---|---|---|---|---|---|---|---|---|---|---|
| 2 | NT | NT | NT | EB, 9 Mrad | 0.396 (36.2) | 10,000+ | NT | NT | NT | 0.55 |
|   | 1.201 (a)/ 1.22 | NT | 1.56 | Gamma, 30 kGy | NT | 10,000+ | 10,000+ | 12.90 (2.0) | 15.55 (2.41) | |
| 3 | NT | NT | NT | EB, 9 Mrad | 0.432 (39.5) | 10,000+ | NT | NT | NT | |
|   | 1.188 (a)/ 1.22 | NT | 2.61 | Gamma, 30 kGy | NT | 10,000+ | 10,000+ | 15.81 (2.45) | 20.0 (3.10) | |
| 4 | NT | NT | NT | EB, 9 Mrad | 0.746 (68.2) | 45 cohesive | NT | NT | NT | |
|   | 1.187 (a)/ 1.22 | 23 | 2.70 | Gamma, 30 kGy | 1.532 (140.0) | 10,000+ | 10,000+ | 19.16 (2.97) | 25.81 (4.00) | |
| 5 | NT | NT | NT | EB, 9 Mrad | 0.135 (12.3) | 10,000+ | NT | NT | NT | 0.83 |
|   | 1.277 (a)/ 1.30 | NT | 1.68 | Gamma, 30 kGy | NT | 10,000+ | NT | 10.90 (1.69) | 12.77 (1.98) | |
| 6 | NT | NT | NT | EB, 9 Mrad | 0.289 (26.4) | 10,000+ | NT | NT | NT | |
|   | 1.275 (a)/ 1.30 | NT | 1.94 | Gamma, 30 kGy | NT | 10,000+ | NT | 12.06 (1.87) | 14.39 (2.23) | |
| 7 | NT | NT | NT | EB, 9 Mrad | 0.326 (29.8) | 144 cohesive | NT | NT | NT | |
|   | 1.278 (a)/ 1.30 | 35 | 1.77 | Gamma, 30 kGy | 1.165 (106.4) | 10,000+ | NT | 15.23 (2.36) | 19.10 (2.96) | |
| 8 | NT | NT | NT | EB, 9 Mrad | (4.1) | 10,000+ | NT | NT | NT | 1.09 |
|   | 1.373 (a)/ 1.38 | NT | 0.53 | Gamma, 30 kGy | NT | 10,000+ | NT | 8.32 (1.29) | 9.29 (1.44) | |
| 9 | NT | NT | NT | EB, 9 Mrad | 0.078 (7.1) | 10,000+ | NT | NT | NT | |
|   | NT | NT | NT | Gamma, 30 kGy | 0.594 (54.4) | 10,000+ | NT | 9.94 (1.54) | 11.42 (1.77) | |
|   | 1.376/ 1.38 | NT | 0.30 | Gamma, 45 kGy | 0.542 (49.6) | NT | NT | NT | NT | |

TABLE 4-continued

| Ex. No. | Density, g/cm³ (measured/ theoretical) | Hardness | % Void Volume | Radiation Type and Target Amount | Peel Adhesion, kN/m (oz/in) Al | Static Shear, Minutes 22° C. | 70° C. | Impedance, ° C.-cm²/W (° C.-in²/W) $Z_{uncorr.}$ | $Z_{corr.}$ | Thermal Bulk Conductivity |
|---|---|---|---|---|---|---|---|---|---|---|
| | NT | NT | NT | Gamma, 60 kGy | 0.192 (17.6) | NT | NT | NT | NT | |
| 10 | NT | NT | NT | EB, 9 Mrad | 0.057 (5.2) | 10,000+ | NT | NT | NT | |
| | 1.394 (a)/ 1.38 | 48 | 0 | Gamma, 30 kGy | NT | 10,000+ | | 9.03 (1.40) | 10.26 (1.59) | |

(a) Measured on samples that were exposed to 45 kGy of gamma radiation

TABLE 5

| Ex. No. | Radiation Type and Amount | Thickness, cm (mils) | Peak Load, kg (lb) | Peak Stress, MPa (psi) | % Strain at Peak Load | Break Load, kg (lb) | Break Stress, MPa (psi) | % Strain at Break | Energy at Break, cm-kg (in-lb) | Modulus, MPa (psi) |
|---|---|---|---|---|---|---|---|---|---|---|
| 4 | EB, 9 Mrad | 0.104 (41) | 0.82 (1.8) | 1.193 (173) | 660.1 | 0.82 (1.8) | 1.188 (172.3) | 670.1 | 33.63 (29.13) | 0.314 (45.6) |
| | Gamma, 30 kGy | 0.109 (43) | 0.73 (1.6) | 1.00 (145) | 902.6 | 0.73 (1.6) | 1.000 (145) | 915.8 | 38.45 (33.3) | 0.163 (23.61) |
| | Gamma, 45 kGy | 0.114 (45) | 0.86 (1.9) | 1.186 (172) | 824.5 | 0.86 (1.9) | 1.185 (171.9) | 826.2 | 46.09 (39.92) | 0.294 (42.64) |
| | Gamma, 60 kGy | 0.117 (46) | 0.95 (2.1) | 1.296 (188) | 684.7 | 0.95 (2.1) | 1.284 (186.3) | 687.1 | 43.54 (37.71) | 0.420 (60.94) |
| 7 | EB, 9 Mrad | 0.107 (42) | 0.82 (1.8) | 1.213 (176) | 309.1 | 0.77 (1.7) | 1.119 (162.3) | 483.4 | 27.84 (24.11) | 0.640 (92.81) |
| | Gamma, 30 kGy | 0.109 (43) | 0.91 (2.0) | 1.241 (180) | 420.3 | 0.77 (1.7) | 1.098 (159.2) | 692.1 | 41.52 (35.96) | 0.443 (64.27) |
| | Gamma, 45 kGy | 0.114 (45) | 1.045 (2.3) | 1.413 (205) | 318 | 0.95 (2.1) | 1.284 (186.3) | 526.5 | 38.24 (33.12) | 0.698 (101.29) |
| | Gamma, 60 kGys | 0.112 (44) | 1.18 (2.6) | 1.641 (238) | 260.7 | 1.14 (2.5) | 1.555 (225.6) | 375.6 | 29.85 (25.85) | 1.002 (145.37) |
| 9 | EB, 9 Mrad | 0.066 (26) | 1.00 (2.2) | 2.302 (334) | 154.4 | 0.91 (2.0) | 2.090 (303.2) | 209.9 | 13.35 (11.56) | 2.197 (318.67) |
| | Gamma, 30 kGy | 0.0685 (27) | 0.82 (1.8) | 1.806 (262) | 290.5 | 0.68 (1.5) | 1.593 (231.1) | 409.7 | 20.27 (17.56) | 0.866 (125.58) |
| | Gamma, 45 kGy | 0.0685 (27) | 0.91 (2.0) | 2.054 (298) | 218.1 | 0.82 (1.8) | 1.832 (265.7) | 310.6 | 17.98 (15.57) | 1.344 (194.89) |
| | Gamma, 60 kGy | 0.074 (29) | 1.045 (2.3) | 2.220 (322) | 182.3 | 0.95 (2.1) | 2.010 (290.9) | 250.1 | 16.76 (14.52) | 1.817 (263.61) |

Samples 1-2

Acrylic thermal interface compositions were prepared using blends of Mg(OH)$_2$ and BN as the conductive fillers, and Pressure Sensitive Adhesive PSA-B of Examples 2-10.

PSA-B was fed at a feed rate of 1.95 kg/hr (4.28 lb/hr) to the feed port in barrel section 3 of the twin-screw extruder of Example 1 via the Bonnot extruder of Example 1. The temperature for all zones in the Bonnot extruder was set at 149° C. (300° F.).

Thermally conductive fillers as specified in Table 7 (parts by weight as specified in Table 7 per 100 parts by weight of PSA-B plus thermally conductive filler) were added as dry solids in one portion at a feed rate of 1.95 kg/hr (4.28 lb/hr) to a feed port in barrel section 1 of the twin screw extruder that was operating at a screw speed set point of 225 rpm for Examples 1a-c and 275 rpm for Examples 2a-c (actual speed about 198 rpm and 246 rpm, respectively). The total flow rate of thermally conductive filler and PSA-B was about 3.90 kg/hr (8.56 lb/hr). In all temperature zones in the twin screw extruder, the temperature was set at 149° C. (300° F.) except for Zone 4 which was set at 93.5° C. (200 F.). A vacuum (in a range from about −77.9+/−10.2 N/m² (−23+/−3 inches of mercury (Hg)) was applied through a port in barrel section 10. The temperature in the three extruder adapters and the flexible hose at the exit end of the extruder were all set at 149° C. (300° F.). The flow rate was controlled with a heated Zenith melt pump, nominally 10.3 cc/rev, set at 149° C. (300° F.).

The extrudate was pumped via the heated hose to a single layer 15.24 cm (6 in) wide drop die with a 0.114 cm (0.045 in) shim, with a gap of about 0.114 cm (0.045 in), set at 149° C. (300° F.).

The compositions were coated at several thicknesses.

TABLE 6

| Samples | Conductive Filler | Weight Percent Conductive Filler | Target Thickness, cm (mils) | Measured Thickness, cm (mils) |
|---|---|---|---|---|
| 1a | 75/25 Mg(OH)$_2$/BN | 50 | 0.0508 (20) | 0.0495 (19.5) |
| 1b | 75/25 Mg(OH)$_2$/BN | 50 | 0.0762 (30) | 0.0673 (26.5) |
| 1c | 75/25 Mg(OH)$_2$/BN | 50 | 0.1016 (40) | 0.0927 (36.5) |
| 2a | 50/50 Mg(OH)$_2$/BN | 50 | 0.0508 (20) | 0.0406 (16.0) |
| 2b | 50/50 Mg(OH)$_2$/BN | 50 | 0.0762 (30) | 0.0889 (35.0) |

TABLE 6-continued

| Samples | Conductive Filler | Weight Percent Conductive Filler | Target Thickness, cm (mils) | Measured Thickness, cm (mils) |
|---|---|---|---|---|
| 2c | 50/50 Mg(OH)$_2$/BN | 50 | 0.1016 (40) | 0.1727 (68.0) |

Sample rolls were prepared as described in Example 1 and then subjected to gamma radiation. Each roll received a target (actual measured) gamma dose of 30 kGy (33.4 to 35.3 kGy).

Sample pieces were cut from the resultant roll and then tested for physical properties, and adhesive performance properties according to the Test Methods outlined above. Results are given in Table 7.

TABLE 7

| Samples | Density, g/cm$^3$ (measured/ theoretical) | % Void Volume | Hardness | Peel Adhesion, kN/m (lb/0.5 in) Al | Static Shear, Minutes 22° C. | Static Shear, Minutes 70° C. | Impedance, ° C.-cm$^2$/W (° C.-in$^2$/W) $Z_{uncorr.}$ | Impedance, ° C.-cm$^2$/W (° C.-in$^2$/W) $Z_{corr.}$ | Thermal Bulk Conductivity |
|---|---|---|---|---|---|---|---|---|---|
| 1a | NT | NT | NT | 0.981 (2.8) | 10,000+ | 10,000+ | 10.13 (1.57) | 11.61 (1.80) | 0.58 |
| 1b | NT | NT | NT | NT | 10,000+ | 10,000+ | 13.74 (2.13) | 16.39 (2.54) | |
| 1c | 1.444 (a)/ 1.614 | 10.5 | 38.2 | NT | 10,000+ | 10,000+ | 15.55 (2.41) | 19.10 (2.96) | |
| 2a | NT | NT | NT | 0.981 (2.8) | 10,000+ | 10,000+ | 9.55 (1.48) | 10.84 (1.68) | 0.81 |
| 2b | NT | NT | NT | NT | 10,000+ | 10,000+ | 16.45 (2.55) | 20.90 (3.24) | |
| 2c | 1.368 (a)/ 1.54 | 11.2 | 32.7 | NT | 10,000+ | NT | 20.52 (3.18) | 27.74 (4.30) | |

(a) single filler feed port.

Samples 3-6

TIMs having stretch release properties were prepared using Exact 3040 and various thermally conductive fillers. Each composition used was coated at several thicknesses.

Preparation of Thermal Interface Composition:

PSA-B of Examples 2-10 was fed to the feed port in barrel section 3 of the twin screw extruder of Example 1 via the Bonnot extruder of Example 1. The temperature for all zones in the Bonnot extruder was set at 149° C. (300° F.). Thermally conductive fillers as specified in Table 9 (parts by weight per 100 parts by weight of PSA-B plus thermally conductive filler) were added as dry solids in one portion to a feed port in barrel section 1 the twin screw extruder that was operating at a screw speed set point of 160 rpm (actual speed about 139 rpm).

The feed rates of PSA-B, thermally conductive filler(s), and Exact 3040 were as shown in Table 8 below.

TABLE 8

| Samples | Feed Rate of PSA-B, kg/hr (lb/hr) | Feed Rate of Filler, kg/hr (lb/hr) | Feed Rate of Exact 3040, kg/hr (lb/hr) |
|---|---|---|---|
| 3a-c | 3.41 (7.5) | 3.73 (8.20) | 1.14 (2.50) |
| 4a-c | 3.41 (7.5) | 3.98 (8.763) | 1.46 (3.21) |
| 5a-c | 1.95 (4.28) | 2.12 (4.67) | 0.65 (1.43) |
| 6a-c | 1.95 (4.28) | 2.27 (5.0) | 0.83 (1.83) |

In the six temperature zones in the twin screw extruder, the temperature was set at 93.5° C. (200° F.) for Zones 1, 2, and 4 and at 149° C. (300° F.) for Zones 3, 5, and 6. A vacuum (in a range from about −77.9+/−10.2 N/m$^2$ (−23+/−3 inches of mercury (Hg)) was applied through a port in barrel section 10. The temperature in the three extruder adapters and the flexible hose at the exit end of the extruder were all set at 149° C. (300° F.). The flow rate was controlled with a heated Zenith melt pump, nominally 10.3 cc/rev, set at 149° C. (300° F.).

The extrudate was pumped via the heated hose to a 15.24 cm (6 in) wide single layer drop die with a gap of about 0.114 cm (0.045 in), set at 149° C. (300° F.). The line speed was adjusted to provide the target thickness as specified in Table 9. The extruded sheet was cast into a nip formed by a two chill rolls (one metal and one rubber), between two silicone coated polyester release liners of Example 1. The nip pressure was set at 0.103 MPa (15 psi). The temperature of the chill rolls was set at 7.5° C. (45° F.).

Sample rolls were prepared as described in Example 1 and then subjected to gamma radiation. Each roll received a target (actual measured) gamma dose of 30 kGy (33.4 to 35.3 kGy).

TABLE 9

| Samples | Conductive Filler | Weight Percent Conductive Filler | Weight Percent Exact 3040 | Target Thickness, cm (mils) | Measured Thickness, cm (mils) |
|---|---|---|---|---|---|
| 3a | Al(OH)$_3$ | 45 | 25 | 0.0508 (20) | 0.0508 (20.0) |
| 3b | Al(OH)$_3$ | 45 | 25 | 0.0762 (30) | 0.066 (26.0) |
| 3c | Al(OH)$_3$ | 45 | 25 | 0.1016 (40) | 0.0965 (38.0) |
| 4a | Al(OH)$_3$ | 45 | 30 | 0.0508 (20) | 0.0526 (20.7) |
| 4b | Al(OH)3 | 45 | 30 | 0.0762 (30) | 0.0483 (19.0) |
| 4c | Al(OH)$_3$ | 45 | 30 | 0.1016 (40) | 0.0978 (38.5) |
| 5a | 95/5 Mg(OH)$_2$/Al(OH)$_3$ | 45 | 25 | 0.0508 (20) | 0.05456 (21.5) |
| 5b | 95/5 Mg(OH)$_2$/Al(OH)$_3$ | 45 | 25 | 0.0762 (30) | 0.0686 (27.0) |
| 5c | 95/5 Mg(OH)$_2$/Al(OH)$_3$ | 45 | 25 | 0.1016 (40) | 0.0914 (36.0) |

TABLE 9-continued

| Samples | Conductive Filler | Weight Percent Conductive Filler | Weight Percent Exact 3040 | Target Thickness, cm (mils) | Measured Thickness, cm (mils) |
|---|---|---|---|---|---|
| 6a | 95/5 Mg(OH)$_2$/Al(OH)$_3$ | 45 | 30 | 0.0508 (20) | 0.0432 (17.0) |
| 6b | 95/5 Mg(OH)$_2$/Al(OH)$_3$ | 45 | 30 | 0.0762 (30) | 0.0737 (29.0) |
| 6c | 95/5 Mg(OH)$_2$/Al(OH)3 | 45 | 30 | 0.1016 (40) | 0.0904 (35.6) |

Sample pieces were cut from the resultant roll and then tested for physical properties, and adhesive performance properties according to the Test Methods outlined above. Results are given in Tables 10 and 11. The test method used for Table 11 was Tensile Break Strength and Elongation Test (Method II).

TABLE 11

| Samples | Thickness, cm (mils) | Peak Load, kg (lb) | % Elongation at Peak Load |
|---|---|---|---|
| 3a | 0.048 (19) | 2.09 (4.6) | 620 |
| 3b | 0.076 (30) | 3.32 (7.3) | 720 |
| 3c | 0.102 (40) | 4.45 (9.8) | 740 |
| 4a | 0.051 (20) | 2.5 (5.5) | 700 |
| 4b | 0.074 (29) | 3.95 (8.7) | 800 |
| 4c | 0.097 (38) | 4.64 (10.2) | 810 |
| 5a | 0.051 (20) | 4 (8.8) | 830 |
| 5b | 0.076 (30) | 4.41 (9.7) | 940 |
| 5c | 0.099 (39) | 5.82 (12.8) | 990 |
| 6a | 0.048 (19) | 3.41 (7.5) | 840 |
| 6b | 0.076 (30) | 4.95 (10.9) | 960 |
| 6c | 0.097 (38) | 5.91 (13.0) | 890 |

TABLE 10

| Samples | Density, g/cm$^3$ (measured/theoretical) | % Void Volume | Hardness | Stretch Release, Failure Mode Glass/glass Al/Al | Peel Adhesion, kN/m (lb/ 0.5 in) Al | Static Shear, Minutes 22° C. | Static Shear, Minutes 70° C. | Impedance, ° C.-cm$^2$/W (° C.-in$^2$/W) $Z_{uncorr.}$ | Impedance, ° C.-cm$^2$/W (° C.-in$^2$/W) $Z_{corr.}$ | Thermal Bulk Conductivity |
|---|---|---|---|---|---|---|---|---|---|---|
| 3a | NT | NT | NT | P-LR / P-SB | 2.21 (6.3) | 10,000+ | 10,000+ | 11.48 (1.78) | 13.48 (2.09) | 0.73 |
| 3b | NT | NT | NT | NT | NT | 10,000+ | 10,000+ | 13.74 (2.13) | 16.65 (2.58) | |
| 3c | 1.4184 (a)/1.62 | 12.44 | 46.7 | NT | NT | 10,000+ | 10,000+ | 16.06 (2.49) | 20.00 (3.10) | |
| 4a | NT | NT | NT | P-LR / F-SB | 12.96 (3.7) | 10,000+ | 10,000+ | 10.65 (1.65) | 12.26 (1.90) | 0.78 |
| 4b | NT | NT | NT | NT | NT | 10,000+ | 10,000+ | 10.90 (1.69) | 12.58 (1.95) | |
| 4c | 1.3042 (a)/1.62 | 19.49 | 53.5 | NT | NT | 10,000+ | 10,000+ | 15.10 (2.34) | 18.58 (2.88) | |
| 5a | NT | NT | NT | P-R / P | 0.245 (0.7) | 10,000+ | 10,000+ | 12.32 (1.91) | 14.52 (2.25) | 0.72 |
| 5b | NT | NT | NT | NT | NT | 10,000+ | 10,000+ | 14.00 (2.17) | 16.97 (2.63) | |
| 5c | 1.270 (a)/1.62 | 21.64 | 53.7 | NT | NT | 10,000+ | 10,000+ | 16.00 (2.48) | 19.68 (3.05) | |
| 6a | NT | NT | NT | P-R / P | 0.280 (0.8) | 10,000+ | 10,000+ | 10.00 (1.55) | 11.48 (1.78) | 0.537 |
| 6b | NT | NT | NT | NT | NT | 10,000+ | 10,000+ | 14.90 (2.31) | 18.58 (2.88) | |
| 6c | 1.275 (a)/1.62 | 21.31 | 59.0 | NT | NT | 10,000+ | 10,000+ | 15.94 (2.47) | 19.94 (3.09) | |

(a) single filler feed port; Al(OH)$_3$ released water at the die temperature
Description and Failure Modes:
P = pass
VLR = very light residue
LR = light residue
SB = sample break
R = residue Samples 7-8

Two thermoplastic elastomeric thermal interface compositions were prepared using a blend of two thermally conductive fillers and different levels of polyphenylene ether. There was no premixing of a pressure sensitive adhesive composition. The composition was coated at several thicknesses.

Preparation of TIMs:

KRATON D1107, a dry blend of BLENDEX HPP857M (PPO) and IRGANOX 1010, and 90/10 weight ratio blend of Mg(OH)$_2$ and Al(OH)$_3$ thermally conductive filler was fed to the feed port in barrel section 1 of a 30 mm co-rotating twin screw extruder with four ports (Werner Pfleider) operating at a screw speed set point of 200 rpm (actual speed about 176 rpm). Wingtack Plus tackifying resin was melted in a Helicon Mixer (with tank set at 149° C. (300° F.), pump and hose set at 163° C. (325° F.)) and pumped to feed port in barrel section 5. SHELLFLEX 371N oil was added through a feed port in barrel section 7 using a Zenith pump. All the components were uniformly melt blended in the extruder.

The components, component amounts, and feed rates are given Table 12. The ratio of polyphenylene ether (PPE) to polystyrene (PS) content of KRATON D1107 (i.e., PPE/PS) was 1.0.

TABLE 12

|  | 7 | | 8 | |
| --- | --- | --- | --- | --- |
| Component | Amount | Feed Rate, kg/hr (lb/hr) | Amount | Feed Rate, kg/hr (lb/hr) |
| Kraton ™ D1107 | 100 | 1.10 (2.428) | 100 | 1.013 (2.228) |
| Wingtack ™ Plus | 155 | 1.71 (3.763) | 161 | 1.6745 (3.684) |
| Shellflex ™ 371N | 22.9 | 0.253 (0.556) | 26.7 | 0.278 (0.611) |
| Irganox ™ 1010 | 3 | 0.033 (0.073) | 3 | 0.0314 (0.069) |
| Blendex ™ HPP857M | 7.4 | 0.082 (0.180) | 15.2 | 0.1582 (0.348) |
| 90/10 weight ratio blend of Mg(OH)$_2$ and Al(OH)$_3$ | 236 | 2.6045 (5.730) | 236 | 2.6045 (5.730) |

The six temperature zones in the twin screw extruder were set as follows: Zones 1 and 2 at 176.5° C. (350° F.), Zone 3 at 163° C. (325° F.), and Zones 4 to 6 at 149° C. (300° F.). A vacuum (in a range from about −77.9+/−10.2 N/m$^2$ (−23 +/−3 inches of mercury (Hg)) was applied through a port in barrel section 10. The temperature in the extruder adapters and the flexible hose at the exit end of the extruder were set at 149° C. (300° F.). The flow rate was controlled with a heated Zenith melt pump, nominally 10.3 cc/rev, set at 160° C. (300° F.). The total flow rate of the extrudate was about 5.79 kg/hr (12.73 lb/hr).

The extrudate was pumped via the heated hose to a 15.24 cm (6 in) wide single layer drop die with a gap of about 0.114 cm (0.045 in), set at 149° C. (300° F.). The line speed was adjusted to provide the target thickness as specified in Table 13. The extruded sheet was cast into a nip formed by a two chill rolls (one metal and one rubber), between two silicone coated polyester release liners of Example 1. The temperature of the chill rolls was set at 7.5° C. (45° F.). The ratio of polyphenylene ether (PPE) to polystyrene (PS) content of KRATON D1107 (i.e., PPE/PS) was 0.5 for Sample 7 and 1.0 for Sample 8. As in Example 1, one liner was removed and the sheet was wound into a roll. Unlike previous examples, Samples 7 and 8 were not exposed to radiation.

TABLE 13

| Samples | Target Thickness, cm (mils) | Measured Thickness, cm (mils) |
| --- | --- | --- |
| 7a | 0.0508 (20) | 0.0584 (23.0) |
| 7b | 0.0762 (30) | 0.0749 (29.5) |
| 7c | 0.1016 (40) | 0.0775 (30.5) |
| 8a | 0.0508 (20) | 0.0610 (24.0) |
| 8b | 0.0762 (30) | 0.0711 (28.0) |
| 8c | 0.1016 (40) | 0.0940 (37.0) |

The resultant article was then tested for physical properties, and adhesive performance properties according to the Test Methods outlined above. Results are given in Table 14 below. For the density calculation, the density of the PSA of Samples 7 and 8 was 0.96 g/cc.

TABLE 14

| Samples | Density, g/cm$^3$ (measured/ theoretical) | % Void Volume | Hardness | Peel Adhesion, kN/m (lb/0.5 in) Al | Static Shear, Minutes 22° C. | 70° C. | Impedance, ° C.-cm$^2$/W (° C.-in$^2$/W) $Z_{uncorr.}$ | $Z_{corr.}$ | Thermal Bulk Conductivity |
| --- | --- | --- | --- | --- | --- | --- | --- | --- | --- |
| 7a | NT | NT | NT | 0.981 (2.8) | 10,000+ | 10,000+ | 16.90 (2.62) | 21.61 (3.35) | 0.759 |
| 7b | NT | NT | NT | NT | 10,000+ | 10,000+ | 23.16 (3.59) | 33.03 (5.12) | |
| 7c | 1.28 (b)/ 1.62 | 21.41 | NT | NT | 10,000+ | 10,000+ | 26.06 (4.04) (a) | 39.00 (6.045) (a) | |
| 8a | NT | NT | NT | 0.981 (2.8) | 10,000+ | 10,000+ | 16.06 (2.49) | 20.26 (3.14) | 0.58 |
| 8b | NT | NT | NT | NT | 10,000+ | 10,000+ | 17.35 (2.69) | 22.45 (3.48) | |
| 8c | 1.28 (b)/ 1.62 | 21.24 | NT | NT | 10,000+ | 10,000+ | 19.35 (3.00) | 26.06 (4.04) | |

(a) For this sample, two pieces were layered together to give a thickness of 0.156 cm (61.50 mils)
(b) single filler port used; Al(OH)$_3$ released water at the die temperature While the various features of the preferred embodiment of the invention have been described in detail, changes to these features and to the described embodiment may be apparent to those skilled in the art. Such changes or modifications are believed to be within the scope and spirit of the invention, as set forth in the following claims.

What is claimed is:

1. A thermal interface material having stretch release properties comprising a blend of polymeric hot melt pressure sensitive adhesive having a number average molecular weight of greater than 25,000, and at least 40 percent by weight of thermally conductive filler based on the total weight of the composition, and substantially continuous, individual viscoelastic microfibers and/or elastic microfibers having a maximum diameter of from about 0.05 to about 5 micrometers dispersed through the adhesive matrix and oriented in the machine direction, wherein the material contains less than about 5 void volume percent.

2. The thermal interface of claim 1 wherein the material contains less than about 1 void volume percent.

3. The thermal interface of claim 1 wherein the thermally conductive filler is selected from the group consisting of ceramics, metal oxides, metal hydroxides, and combinations thereof.

4. The thermal interface material of claim 1 wherein the thermally conductive filler is selected from the group consisting from boron nitride, silicon nitride, aluminum nitride, titanium nitride, aluminum oxide, beryllia, zirconia, silicon carbide, boron carbide, magnesium hydroxide, magnesium oxide, aluminum hydroxide, and combinations thereof.

5. The thermal interface material of claim 1 further having a liner adjacent to said adhesive film.

6. The thermal interface material of claim 1 further having at least one skin adhesive layer attached to at least a portion of said film.

7. The thermal interface material of claim 6 wherein the at least one adhesive skin layer contains thermally conductive filler.

8. The thermal interface of claim 1 having a bulk thermal conductivity of at least about 0.5 Watts/meter-K.

9. The thermal interface of claim 1 further comprising a fire retardant.

* * * * *

UNITED STATES PATENT AND TRADEMARK OFFICE
CERTIFICATE OF CORRECTION

PATENT NO.         : 7,229,683 B2
APPLICATION NO. : 10/449156
DATED               : June 12, 2007
INVENTOR(S)      : Patrick J. Fischer It is certified that error appears in the above-identified patent and that said Letters Patent is hereby corrected as shown below:

<u>Title Page, 2nd Column, (57) ABSTRACT</u>
Line 2, delete "comprising" and insert --including--
Line 9, delete "comprise" and insert --include--

<u>Column 1</u>
Line 39, after "example" delete "f"

<u>Column 12</u>
Line 54, delete "fluorochermicals" and insert --fluorochemicals--

<u>Column 17</u>
Line 15, delete "C-114" and insert --C-1114--

<u>Column 23, TABLE 3-continued</u>
First row under column headings, column 4, above "(3.33)", insert --(1.51)--
First row under column headings, column 5, above "(3.33)", insert --(1.51)--

Signed and Sealed this

Twenty-seventh Day of November, 2007

JON W. DUDAS
*Director of the United States Patent and Trademark Office*